US012568663B2

(12) United States Patent
Ostermayr et al.

(10) Patent No.: US 12,568,663 B2
(45) Date of Patent: Mar. 3, 2026

(54) THRESHOLD VOLTAGE TUNING FOR NANORIBBON-BASED TRANSISTORS

(71) Applicant: Intel Corporation, Santa Clara, CA (US)

(72) Inventors: Martin Ostermayr, Woerth BY (DE); Joachim Assenmacher, Unterhaching (DE); Georg Seidemann, Landshut (DE); Klaus Herold, Munich (DE); Walther Lutz, Erding (DE)

(73) Assignee: Intel Corporation, Santa Clara, CA (US)

( * ) Notice: Subject to any disclaimer, the term of this patent is extended or adjusted under 35 U.S.C. 154(b) by 957 days.

(21) Appl. No.: 17/530,836

(22) Filed: Nov. 19, 2021

(65) Prior Publication Data

US 2023/0163170 A1 May 25, 2023

(51) Int. Cl.
H10D 62/10 (2025.01)
H10D 30/01 (2025.01)
H10D 30/67 (2025.01)

(52) U.S. Cl.
CPC ......... H10D 62/121 (2025.01); H10D 30/031 (2025.01); H10D 30/6735 (2025.01); H10D 30/6757 (2025.01)

(58) Field of Classification Search
None
See application file for complete search history.

(56) References Cited

U.S. PATENT DOCUMENTS

| | | | | |
|---|---|---|---|---|
| 9,601,569 B1 * | 3/2017 | Suk | ................... | H10D 30/6735 |
| 2014/0353574 A1 * | 12/2014 | Li | ..................... | H10D 62/8503 |
| | | | | 438/284 |
| 2021/0013107 A1 * | 1/2021 | Gardner | ................ | H10D 84/83 |

(Continued)

OTHER PUBLICATIONS

Loubet, N., et al., "Nanosheet Transistor as a Replacement of FinFET for Future nodes : Device Advantages & Specific Process Elements," Symposia on VLSI Technology and Circuits; 12 pages (2020).

(Continued)

*Primary Examiner* — Sue A Purvis
*Assistant Examiner* — Carnell Hunter, III
(74) *Attorney, Agent, or Firm* — Akona IP PC

(57) ABSTRACT

Fabrication methods that may provide greater versatility in tuning threshold voltage of transistors implemented in different nanoribbons within a given stack and in tuning threshold voltage of transistors implemented in adjacent nanoribbon stacks, as well as corresponding devices, are disclosed. An example fabrication method includes selectively doping portions of semiconductor layers from which individual nanoribbons will be formed later. The selective doping is performed on a layer-by-layer basis, i.e., after a given semiconductor layer is deposited and before the next layer is deposited. In this manner, some nanoribbons of a given nanoribbon stack may be doped, while other nanoribbons of the same stack may be substantially undoped, or, more generally, different nanoribbons of a given nanoribbon stack may have different dopant concentrations. The differences in the dopant concentration of different nanoribbons within the stack advantageously allows forming transistors with different threshold voltages in a single nanoribbon stack.

20 Claims, 16 Drawing Sheets

(56) References Cited

U.S. PATENT DOCUMENTS

| 2021/0134794 | A1* | 5/2021 | Huang | ................ | H10D 30/031 |
| 2021/0135016 | A1* | 5/2021 | Wan | ................. | H01L 21/28255 |
| 2021/0193802 | A1* | 6/2021 | Lilak | .................... | H10D 30/62 |
| 2022/0320337 | A1* | 10/2022 | Chen | ................... | H10D 30/024 |

OTHER PUBLICATIONS

Yoshida, N., et al., "Threshold voltage tuning by metal gate work function modulation for 10 nm CMOS integration and beyond," IEEE; Abstract only, 2 pages; (Published 2014).

* cited by examiner

200

202 — Deposit alternate layers of semiconductor and sacrificial materials in a stack, implant dopants as needed 204 — Pattern the stack to form a fin from which nanoribbons will be formed 206 — Form the nanoribbons from the fin 208 — Perform the rest of nanoribbon transistor fabrication

400D 326-2

332

326-1

330

X

Z

400C 326-2

332

326-1

330

328-2

328-1

X

Z

| 302 | 304 | 306 | 312 | 324 | 334 | 336 |

2000

2002

2002

THRESHOLD VOLTAGE TUNING FOR NANORIBBON-BASED TRANSISTORS

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
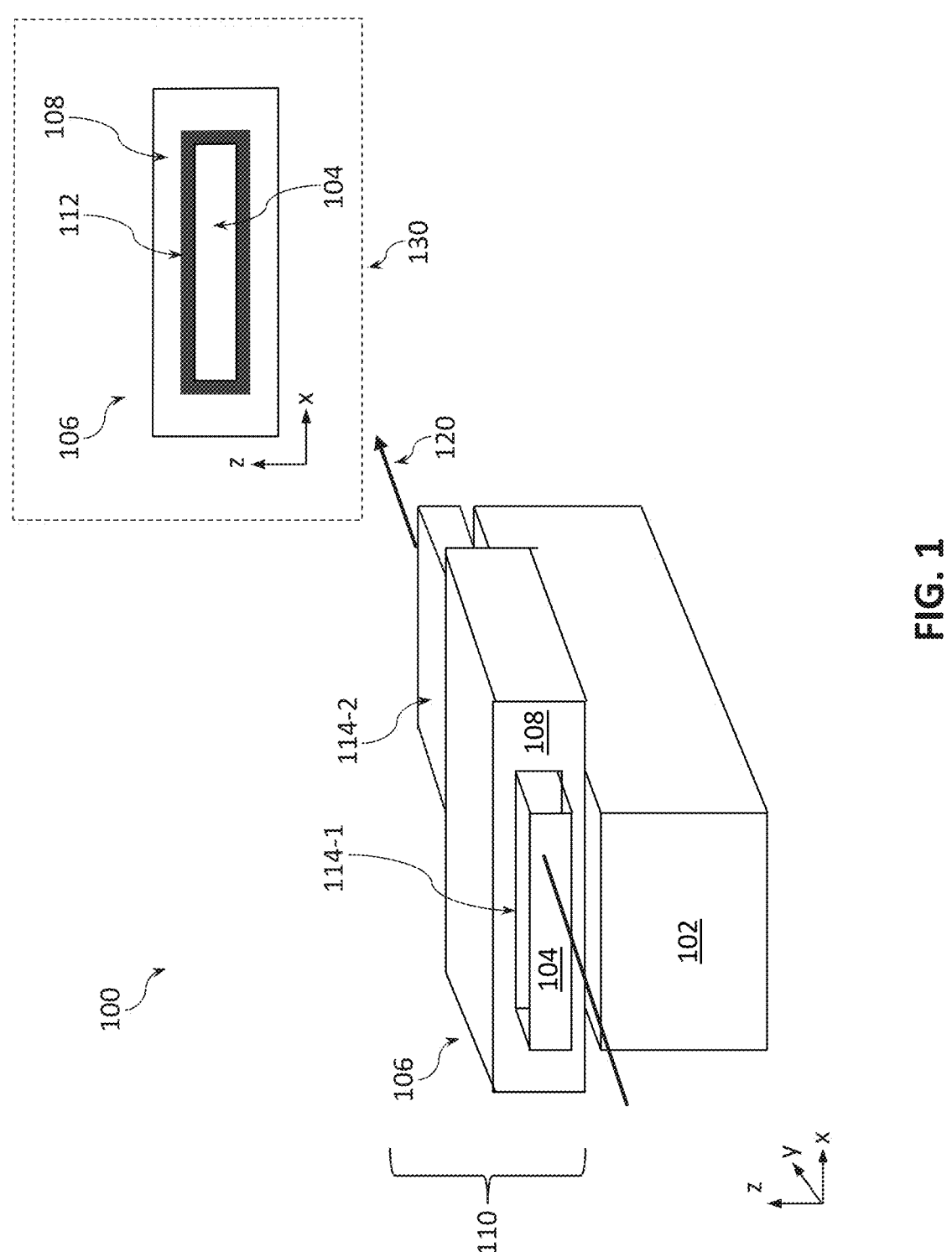
FIG. 1 provides a perspective view of an example nanoribbon-based field-effect transistor (FET), according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating threshold voltage tuning for nanoribbon-based transistors, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

Non-planar transistors such as double-gate transistors, trigate transistors, FinFETs, and nanowire/nanoribbon/nanosheet transistors refer to transistors having a non-planar architecture. In comparison to a planar architecture where the transistor channel has only one confinement surface, a non-planar architecture is any type of architecture where the transistor channel has more than one confinement surfaces. A confinement surface refers to a particular orientation of the channel surface that is confined by the gate field. Non-planar transistors potentially improve performance relative to transistors having a planar architecture, such as single-gate transistors.

Nanoribbon-based transistors may be particularly advantageous for continued scaling of complementary metal-oxide-semiconductor (CMOS) technology nodes due to the potential to form gates on all four sides of a channel material (hence, such transistors are sometimes referred to as "gate all around" transistors). As used herein, the term "nanoribbon" refers to an elongated structure of a semiconductor material having a longitudinal axis parallel to a support structure (e.g., a substrate, a die, a chip, or a wafer) over which such a structure is provided. Typically, a length of a such a structure (i.e., a dimension measured along the longitudinal axis, shown in the present drawings to be along the y-axis of an example x-y-z coordinate system) is greater than each of a width (i.e., a dimension measured along the x-axis of the example coordinate system shown in the present drawings) and a thickness/height (i.e., a dimension measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections. In the present disclosure, the term "nanoribbon" is used to refer to all such nanowires, nanoribbons, and nanosheets, as well as elongated semiconductor structures with a longitudinal axis parallel to the support structures and with having transverse cross-sections of any geometry (e.g., transverse cross-sections in the shape of an oval or a polygon with rounded corners). A transistor may then be described as a "nanoribbon-based transistor" if the channel of the transistor is a portion of a nanoribbon, i.e., a portion around which a gate stack of a transistor may wrap around. The semiconductor material in the portion of the nanoribbon that forms a channel of a transistor may be referred to as a "channel material," with source and drain (S/D) regions of a transistor provided on either side of the channel material.

Typically, nanoribbon-based transistor arrangements include stacks of nanoribbons, where each stack includes two or more nanoribbons stacked above one another, with a single gate stack that includes a work function material and, optionally, a gate dielectric material, provided for an entire stack or multiple stacks. Threshold voltage tuning of conventional nanoribbon-based transistor arrangements may be realized by selecting a certain semiconductor material to be used for the nanoribbons in combination with certain work function material to be used in the gate stack, as well as other design parameters.

Embodiments of the present disclosure are based on recognition that conventional means for threshold voltage tuning of nanoribbon-based transistors may be improved. In particular, fabrication methods that may provide greater versatility in tuning threshold voltage of transistors implemented in different nanoribbons within a given stack and of transistors implemented in adjacent nanoribbon stacks, as well as corresponding devices, are disclosed. An example fabrication method includes selectively doping portions of semiconductor layers from which individual nanoribbons will be formed later. The selective doping is performed on a layer-by-layer basis, i.e., after a given semiconductor layer is deposited and before the next layer is deposited. In this manner, some nanoribbons of a given nanoribbon stack may be doped with one or more dopants (either in some portions or in the entire nanoribbons), while other nanoribbons of the same stack may be substantially undoped, or, more generally, different nanoribbons of a given nanoribbon stack may have different dopant concentrations. The differences in the dopant concentration of different nanoribbons within the stack advantageously allows forming transistors with different threshold voltages in a single nanoribbon stack. Further options for additional threshold voltage tuning may include using different work function materials for different nanoribbon stacks, using different gate dielectric materials for different nanoribbon stacks, using different nanoribbon widths for different nanoribbon stacks, and using different spacing between nanoribbons of a given stack. Nanoribbon-based transistors for which threshold voltage tuning as described herein has been implemented may introduce additional degrees of freedom in transistor choices in terms of, e.g., high-voltage handling, speed, etc.

As is known in the field of semiconductor devices, both N-type and P-type dopants may be present within a semiconductor material, but a semiconductor material may be described as doped with N-type dopants when the amount of N-type dopants in the material is higher, typically significantly higher, than the amount of P-type dopants. Similarly, a semiconductor material may be described as doped with P-type dopants when the amount of P-type dopants in the material is higher, typically significantly higher, than the amount of N-type dopants. Reference to a "dopant concentration" then implies dopant concentrations of the type of dopants with the greater amount.

IC devices as described herein, in particular IC devices implementing threshold voltage tuning for nanoribbon-based transistors, may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. In some embodiments, IC devices as described herein may be included in a radio frequency IC (RFIC), which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, IC devices as described herein may be included in memory devices or circuits. In some embodiments, IC devices as described herein may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations. The terms "substantially," "close," "approximately," "near," and "about," generally refer to being within +/−10% of a target value, e.g., within +/−5% of a target value, based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

In the following description, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4D, such a collection may be referred to herein without the letters, e.g., as "FIG. 4."

In the drawings, while some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of nanoribbon-based transistors implementing features of threshold voltage tuning as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

FIG. 1 provides a perspective view of an example IC device 100 with a nanoribbon-based transistor 110 (in particular, a FET) in which threshold voltage tuning as described herein may be implemented, according to some embodiments of the present disclosure. For example, in various embodiments, the transistor 110 formed on the basis of a nanoribbon 104, shown in FIG. 1, may be formed on the basis of any of the nanoribbons 330 of the IC devices with nanoribbon-based transistor arrangements shown in FIG. 3H or any of FIGS. 4A-4D, except that the transistors formed therein would be formed in the stacks of lateral nanoribbons, as described herein.

Turning to the details of FIG. 1, the IC device 100 may include a semiconductor material, which may include one or more semiconductor materials, formed as a nanoribbon 104 extending substantially parallel to a support structure 102. The transistor 110 may be formed on the basis of the nanoribbon 104 by having a gate stack 106 wrap around at least a portion of the nanoribbon referred to as a "channel portion" and by having source and drain regions, shown in FIG. 1 as a first source or drain (S/D) region 114-1 and a second S/D region 114-2, on either side of the gate stack 106. One of the S/D regions 114 is a source region and the other one is a drain region. However, because, as is common in the field of FETs, designations of source and drain are often interchangeable, they are simply referred to herein as a first S/D region 114-1 and a second S/D region 114-2. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, is intended to show relative arrangements of some of the components therein, and the IC device 100, or portions thereof, may include other components that are not illustrated (e.g., electrical contacts to the S/D regions 114 of the transistor 110, additional layers such as a spacer layer around the gate electrode of the transistor 110, etc.). For example, although not specifically illustrated in FIG. 1, a dielectric spacer may be provided between a first S/D electrode (which may also be referred to as a "first S/D contact") coupled to a first S/D region 114-1 of the transistor 110 and the gate stack 106 as well as between a second S/D electrode (which may also be referred to as a "second S/D contact") coupled to a second S/D region 114-2 of the transistor 110 and the gate stack 106 in order to provide electrical isolation between the source, gate, and drain electrodes. In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Implementations of the present disclosure may be formed or carried out on any suitable support structure 102, such as a substrate, a die, a wafer, or a chip. The support structure 102 may, e.g., be the wafer 2000 of FIG. 5, discussed below, and may be, or be included in, a die, e.g., the singulated die 2002 of FIG. 5, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device implementing threshold voltage tuning for nanoribbon-based transistors as described herein may be built falls within the spirit and scope of the present disclosure.

The nanoribbon 104 may take the form of a nanowire or nanoribbon, for example. In some embodiments, an area of a transversal cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). In some embodiments, a width of the nanoribbon 104 (i.e., a dimension measured in a plane parallel to the support structure 102 and in a direction perpendicular to a longitudinal axis 120 of the nanoribbon 104, e.g., along the y-axis of the example coordinate system shown in FIG. 1) may be at least about 3 times larger than a height of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger. Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The term "face" of a nanoribbon may refer to the side of the nanoribbon 104 that is larger than the side perpendicular to it (when measured in a plane substantially perpendicular to the longitudinal axis 120 of the nanoribbon 104), the latter side being referred to as a "sidewall" of a nanoribbon.

In various embodiments, the semiconductor material of the nanoribbon 104 may be composed of semiconductor material systems including, for example, N-type or P-type materials systems. In some embodiments, the nanoribbon 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the nanoribbon 104 may include a combination of semiconductor materials. In some embodiments, the nanoribbon 104 may include a monocrystalline semiconductor, such as silicon (Si) or germanium (Ge). In some embodiments, the nanoribbon 104 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an N-type metal-oxide-semiconductor (NMOS) transistor), the channel material of the nanoribbon 104 may include a III-V material having a relatively high electron mobility, such as, but not limited to InGaAs, InP, InSb, and InAs. For some such embodiments, the channel material of the nanoribbon 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (i.e., for the embodiments where the transistor 110 is a P-type metaloxide-semiconductor (PMOS) transistor), the channel material of the nanoribbon 104 may advantageously be a group IV material having a high hole mobility, such as, but not limited to Ge or a Ge-rich SiGe alloy. For some example embodiments, the channel material of the nanoribbon 104 may have a Ge content between 0.6 and 0.9, and advantageously may be at least 0.7.

In some embodiments, the channel material of the nanoribbon 104 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 104 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 104 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

A gate stack 106 including a gate electrode material 108 and, optionally, a gate dielectric material 112, may wrap entirely or almost entirely around a portion of the nanoribbon 104 as shown in FIG. 1, with the active region (channel region) of the channel material of the transistor 110 corresponding to the portion of the nanoribbon 104 wrapped by the gate stack 106. The gate dielectric material 112 is not shown in the perspective drawing of the IC device 100 shown in FIG. 1, but is shown in an inset 130 of FIG. 1, providing a cross-sectional side view of a portion of the nanoribbon 104 with a gate stack 106 wrapping around it. As shown in FIG. 1, the gate dielectric material 112 may wrap around a transversal portion of the nanoribbon 104 and the gate electrode material 108 may wrap around the gate dielectric material 112.

The gate electrode material 108 may include at least one P-type work function metal or N-type work function metal, depending on whether the transistor 110 is a PMOS transistor or an NMOS transistor (P-type work function metal used as the gate electrode material 108 when the transistor 110 is a PMOS transistor and N-type work function metal used as the gate electrode material 108 when the transistor 110 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric material 112 may include one or more high-k dielectrics including any of the materials discussed herein with reference to the insulator material that may surround portions of the transistor 110. In some embodiments, an annealing process may be carried out on the gate dielectric material 112 during manufacture of the transistor 110 to improve the quality of the gate dielectric material 112. The gate dielectric material 112 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, e.g., when the transistor 110 is a storage transistor of a hysteretic memory cell (i.e., a type of memory that functions based on the phenomenon of hysteresis), the gate dielectric 112 may be replaced with, or complemented by, a hysteretic material. In some embodiments, a hysteretic material may be provided as a layer of a ferroelectric (FE) or an antiferroelectric (AFE) material. Such an FE/AFE material may include one or more materials that can exhibit sufficient FE/AFE behavior even at thin dimensions, e.g., such as an insulator material at least about 10% of which is in an orthorhombic phase or a tetragonal phase (e.g., as a material in which at most about 90% of the material may be amorphous or in a monoclinic phase). Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used to replace, or to complement, the gate dielectric 112, and are within the scope of the present disclosure. The FE/AFE material included in the gate stack 106 may have a thickness that may, in some embodiments, be between about 0.5 nanometers and 10 nanometers, including all values and ranges therein (e.g., between about 1 and 8 nanometers, or between about 0.5 and 5 nanometers). In other embodiments, a hysteretic material may be provided as a stack of materials that, together, exhibit hysteretic behavior. Such a stack may include, e.g., a stack of silicon oxide and silicon nitride. Unless specified otherwise, descriptions provided herein with respect to the gate dielectric 112 are equally application to embodiments where the gate dielectric 112 is replaced with, or complemented by, a hysteretic material.

Turning to the S/D regions 114 of the transistor 110, in some embodiments, the S/D regions may be highly doped, e.g., with dopant concentrations of about $10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions of a transistor are the regions having dopant concentration higher than in other regions, e.g., higher than a dopant concentration in the transistor channel (i.e., in a channel material extending between the first S/D region 114-1 and the second S/D region 114-2), and, therefore, may be referred to as "highly doped" (HD) regions. Even with doped to realize threshold voltage tuning as described herein, the channel portions of transistors typically include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

The nanoribbon 104 may form a basis for forming nanoribbon-based transistor arrangements implementing gate all around.

Figure 2:
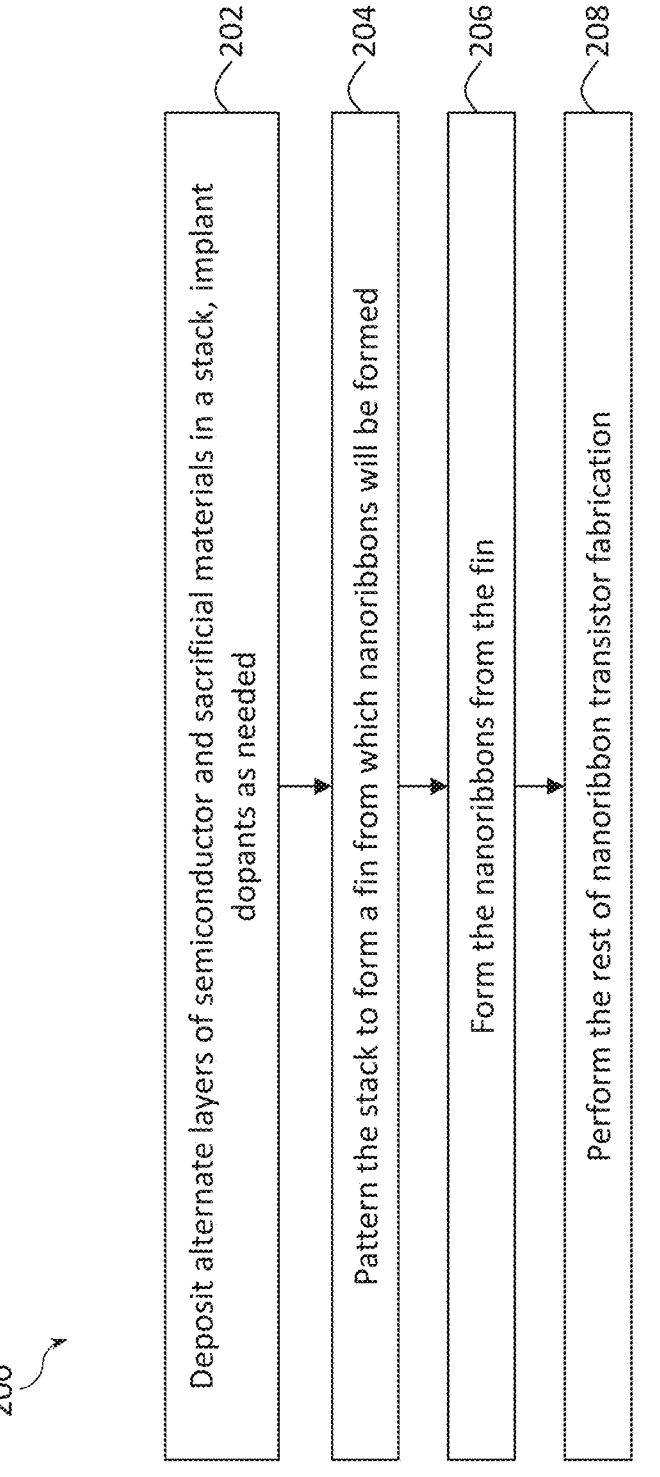
FIG. 2 is a flow diagram of an example method of manufacturing an integrated circuit (IC) device with threshold voltage tuning for nanoribbon-based transistors, in accordance with some embodiments.

FIG. 2 is a flow diagram of an example method 200 of manufacturing an IC device with threshold voltage tuning for nanoribbon-based transistors, in accordance with some embodiments. Although the operations of the method 200 are illustrated once each and in a particular order, the operations may be performed in any suitable order and repeated as desired. For example, one or more operations may be performed in parallel to manufacture multiple IC devices implementing threshold voltage tuning for nanoribbon-based transistors substantially simultaneously. In another example, the operations may be performed in a different order to reflect the structure of an IC device in which threshold voltage tuning for nanoribbon-based transistors will be implemented.

In addition, the example manufacturing method 200 may include other operations not specifically shown in FIG. 2, such as various cleaning or planarization operations as known in the art. For example, in some embodiments, the support structure 102, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the intermediate IC devices described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

FIGS. 3A-3H provide top-down and cross-sectional side views at various stages in the manufacture of an example IC device implementing threshold voltage tuning for nanoribbon-based transistors according to the method 200 of FIG. 2, in accordance with some embodiments. Each of FIGS. 3A-3H provides a top-down view (i.e., a view in the x-y plane of the example coordinate system shown in FIGS. 1, 3, and 4) and a cross-sectional side view (i.e., a view in the x-z plane of the example coordinate system shown in FIGS. 1, 3, and 4) of the respective transistor arrangements. The cross-sectional side views of FIGS. 3A-3H illustrate cross-sections taken along a plane AA shown with a dashed line in the top-down views of these drawings (the plane AA being substantially perpendicular to the pages of the drawings and including the dashed line shown in the top-down view of FIGS. 3A-3E).

A number of elements referred to in the description of FIGS. 3A-3H with reference numerals are illustrated in these figures with different patterns, with a legend showing the correspondence between the reference numerals and patterns being provided at the bottom of each drawing page containing FIGS. 3A-3H. For example, the legend illustrates that FIGS. 3A-3H use different patterns to show a support structure 302, a semiconductor material 304, a sacrificial material 306, and so on. Furthermore, although a certain number of a given element may be illustrated in some of FIGS. 3A-3H (e.g., two stacks of nanoribbons 390, with four nanoribbons 390 in each stack), this is simply for ease of illustration, and more, or less, than that number may be included in other nanocomb-based transistor arrangements implementing gate all around according to various embodiments of the present disclosure. Still further, various views shown in FIGS. 3A-3H are intended to show relative arrangements of various elements therein, and various IC devices implementing threshold voltage tuning for nanoribbon-based transistors, or portions thereof, may include other elements or components that are not illustrated (e.g., transistor portions, various components that may be in electrical contact with any of the transistor portions, etc.).

Figure 3A:
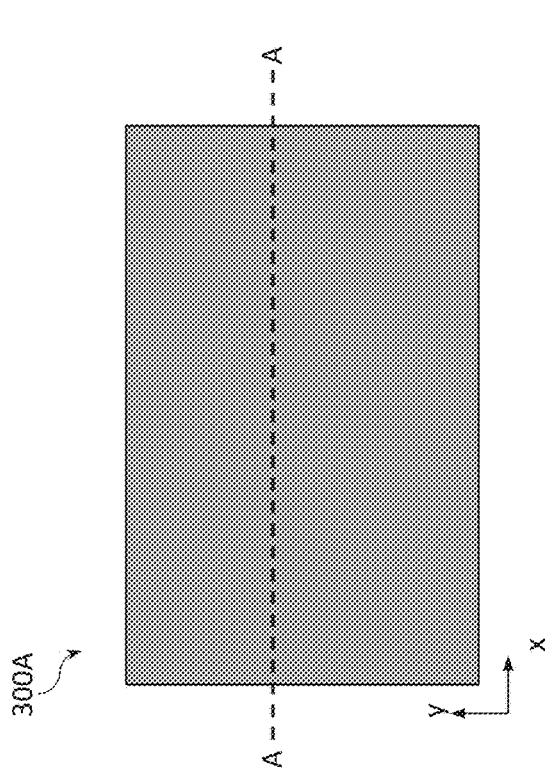
FIGS. 3A-3H provide top-down and cross-sectional side views at various stages in the manufacture of an example IC device implementing threshold voltage tuning for nanoribbon-based transistors according to the method of FIG. 2, in accordance with some embodiments.
Figure 3A:
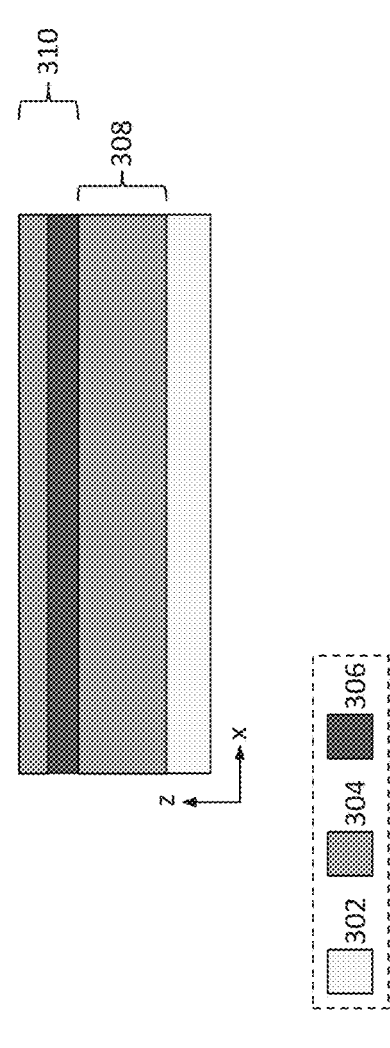

The method 200 may begin with a process 202 that includes providing alternate layers of semiconductor and sacrificial materials in a stack, implanting dopants into the semiconductor layers as needed to realize voltage tuning. An IC device 300A of FIG. 3A illustrates an example result of starting the process 202 by providing a few alternate layers. The IC device 302 includes a support structure 302 and alternate layers of a semiconductor material 304 and a sacrificial material 306 forming a stack 310. As shown in FIG. 3A, in some embodiments, the alternation of layers of the semiconductor material 304 and the sacrificial material 306 may begin after, first, a base 308 of the semiconductor material 304 is provided over the support structure 302. In various embodiments, the support structure 302 may be the support structure 102, described above. The semiconductor material 304 may any of the semiconductor/channel materials described above with reference to the nanoribbon 104. The sacrificial material 306 may be any suitable material that is etch-selective with respect to the semiconductor material 304 in order to be able to etch, in a later process, the sacrificial material 306 to form nanoribbons of the semiconductor material 304. As known in the art, two materials are said to be "etch-selective" (or said to have "sufficient etch selectivity") with respect to one another when etchants used to etch one material do not substantially etch the other, enabling selective etching of one material but not the other. In some embodiments, the sacrificial material 306 may be a semiconductor material. For example, in some embodiments, the semiconductor material 304 may be silicon while the sacrificial material 306 may be silicon germanium. Using a sacrificial material that is a semiconductor material advantageously allows providing the alternate layers of the semiconductor material 304 and the sacrificial material 306 in the process 202 by epitaxially growing layers of the semiconductor material 304 and the sacrificial material 306. In other embodiments, alternate layers of the semiconductor material 304 and the sacrificial material 306 may be provided in the process 202 using other techniques, such as layer transfer or thin-film deposition.

The process 202 includes implanting dopants into the individual semiconductor layers on as-needed basis in order to realize voltage tuning. To that end, after each layer of the semiconductor material 304 is deposited in the process 202, dopants may be provided within the entire layer or a portion of a layer. One example illustration of providing dopants within a layer of the semiconductor material 304 of the IC device 300A is shown with an IC device 300B, shown in FIG. 3B, providing an example of including dopants using ion implantation to dope substantially all of the layer of the semiconductor material 304 of the IC device 300A, resulting in a doped semiconductor material 312 in the IC device 300B. Another example illustration is shown with an IC device 300C, shown in FIG. 3C, providing an example of including dopants using ion implantation to dope only a portion of the layer of the semiconductor material 304 of the IC device 300A. In such embodiments, a mask 314 may be provided over the semiconductor material 304 before ion implantation begins so that a portion of the semiconductor material 304 of the IC device 300A that is covered with the mask 314 will not be doped and only the portion that is exposed through the mask 314 will be doped and, thus, converted to the doped semiconductor material 312. FIG. 3C illustrates an embodiment where the mask 314 may be provided over the portion of the semiconductor material 304 that, in a later process, will form a separate nanoribbon stack from that of the portion not covered by the mask 314. However, in general, the process 202 may include providing dopants selectively within any suitable portions of any of the layers of the semiconductor material 304, another example of which is shown with an IC device 300D, shown in FIG. 3D, illustrating a more complicated pattern of the mask 314. In general, any pattern may be used for the mask 314 to provide dopants in any portion of any layer of the semiconductor material 304 deposited in the process 202.

After dopants have been provided within a desired portion of a given layer of the semiconductor material 304, the mask 314 may be removed, another layer of the sacrificial material 306 may be provided over the last layer of the semiconductor material 304, followed by a new layer of the semiconductor material 304 and portions of that new layer may then be doped on as-needed basis. Thus, the process 202 includes providing dopants within the semiconductor material 304 on a layer-by-layer basis, i.e., after a given layer of the semiconductor material 304 is provided it may be doped in the desired portions, to the desired concentrations, and only after that the sacrificial material 306 and the next layer of the semiconductor material 304 may be provided.

Figure 3B:
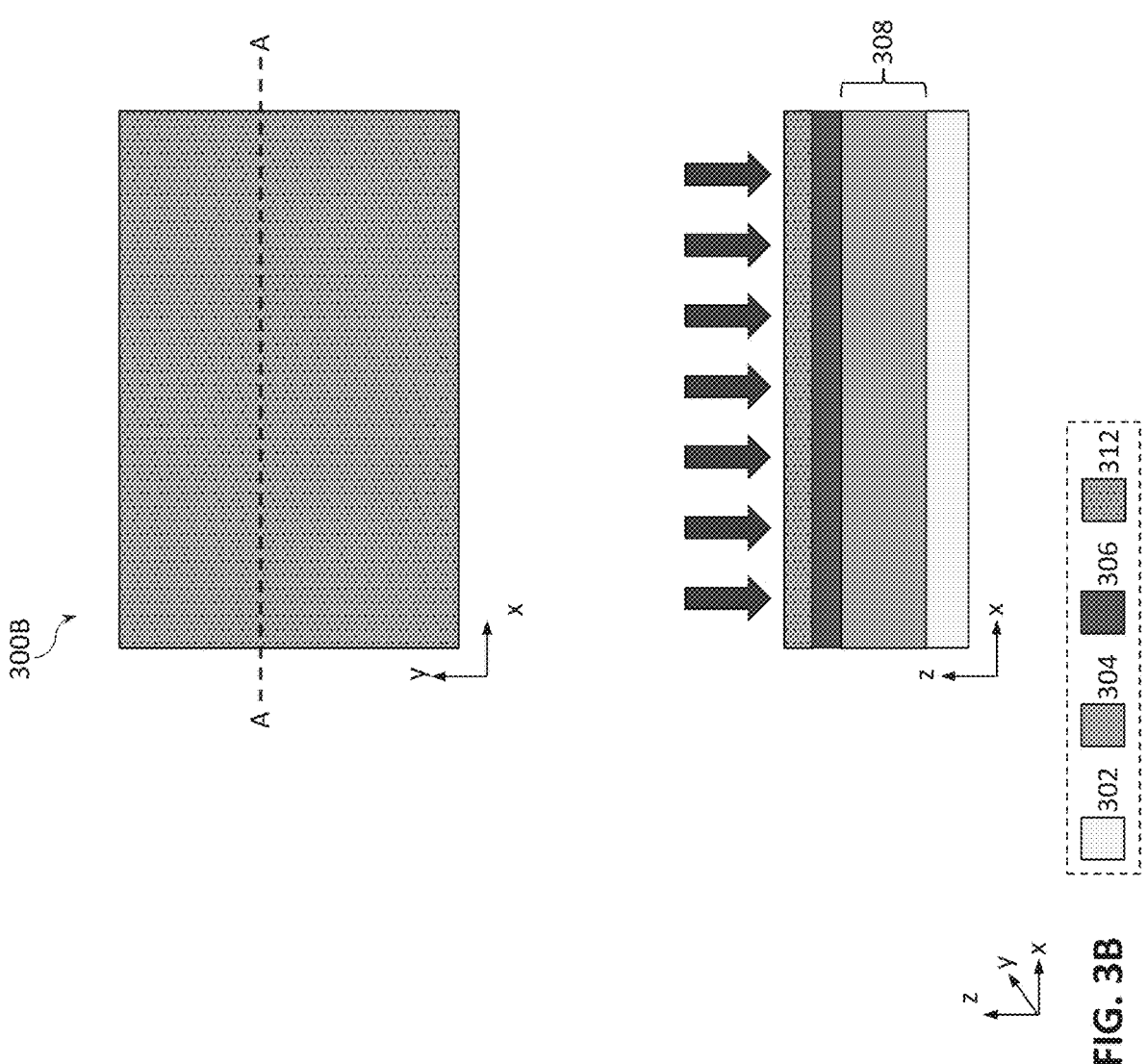
Figure 3C:
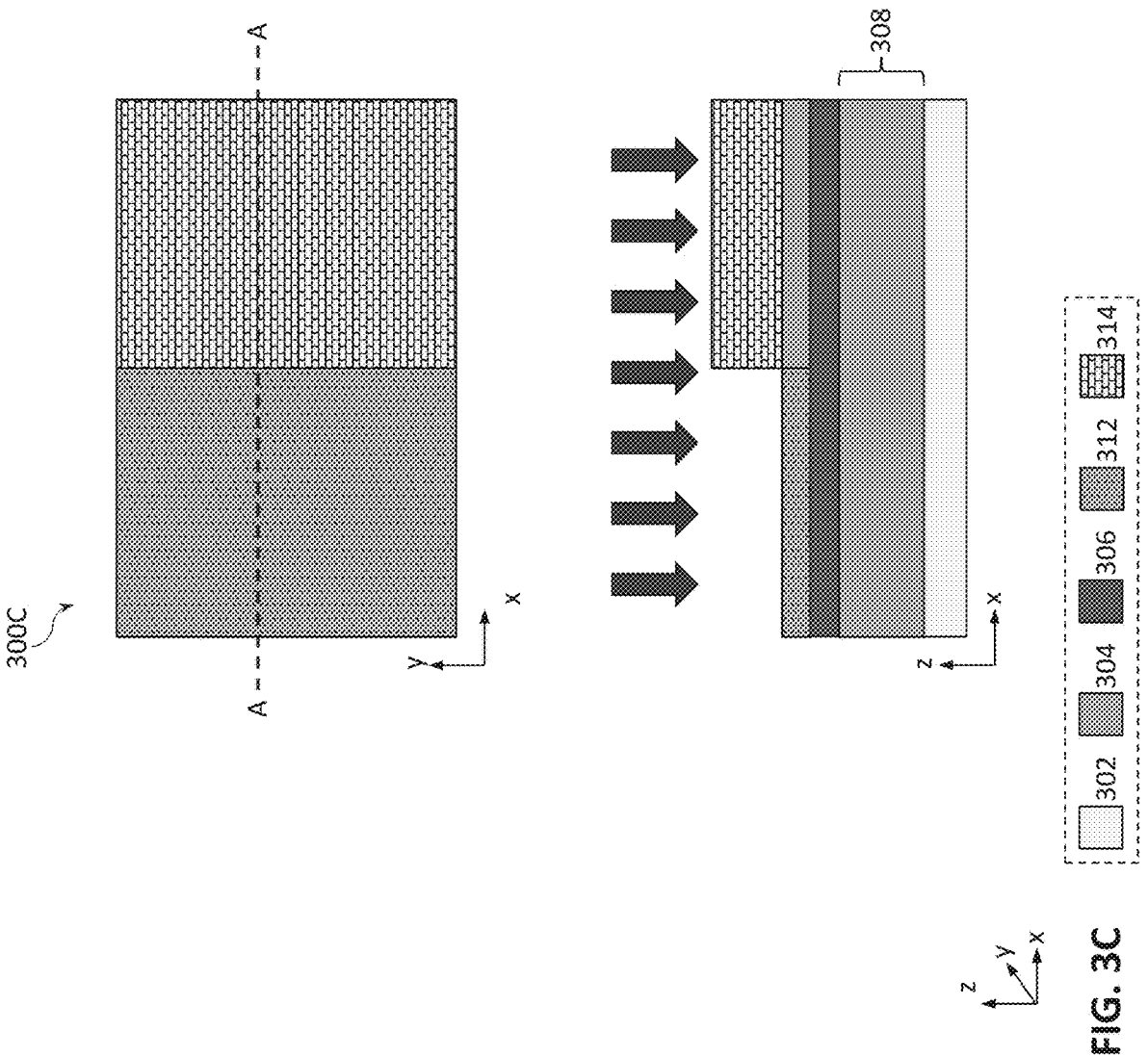
Figure 3D:
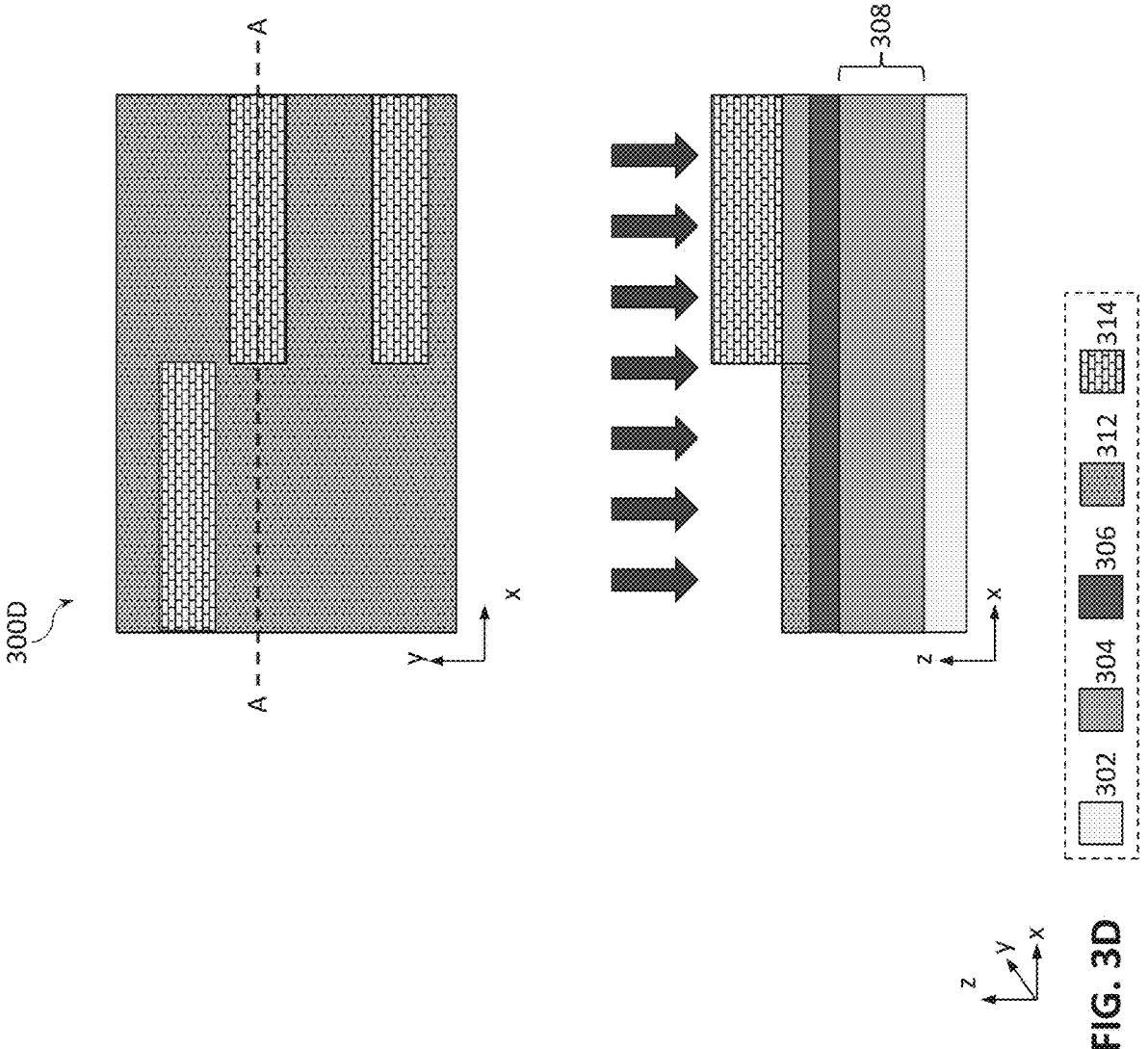
Figure 3E:
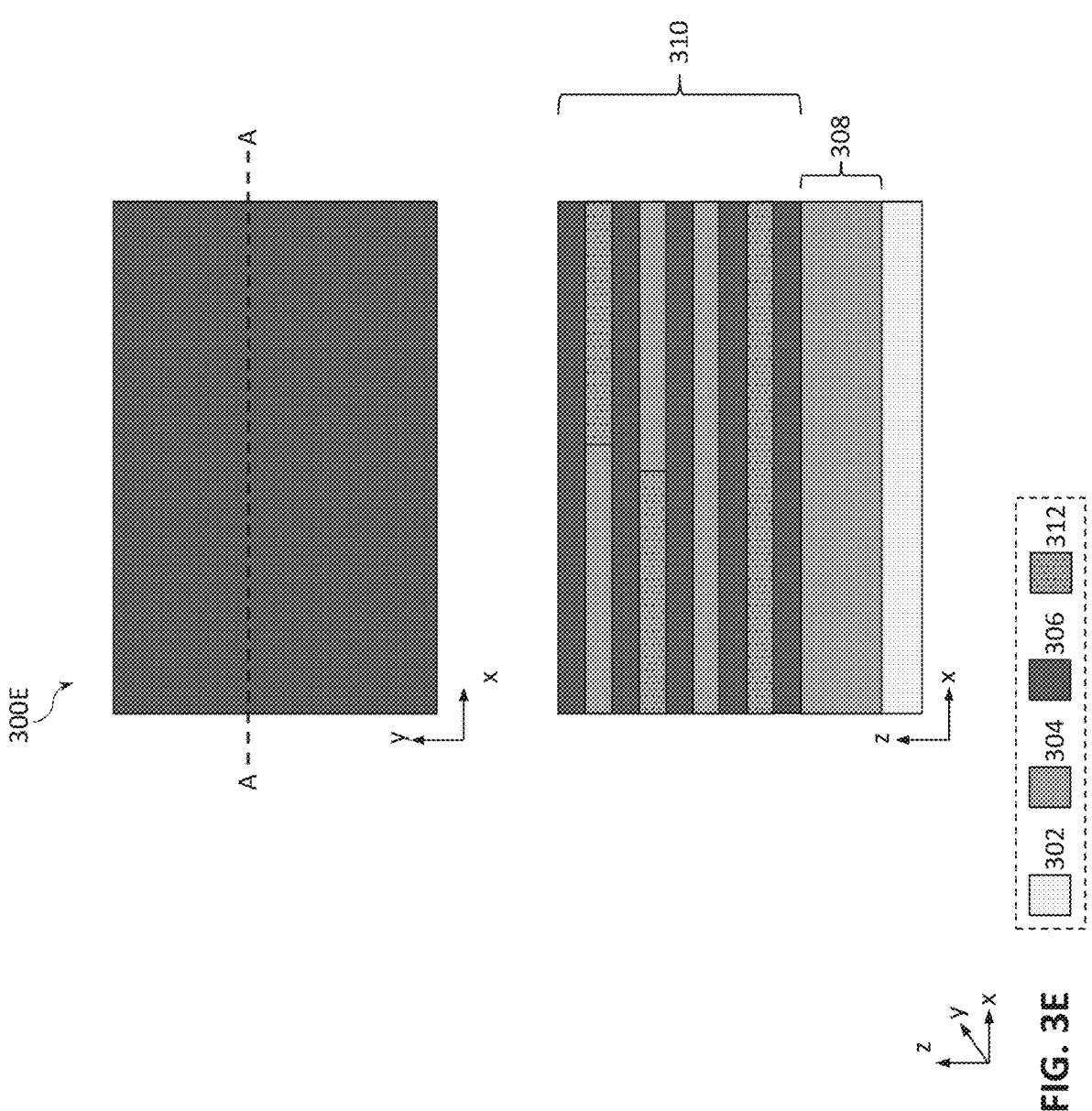

FIG. 3E illustrates an IC device 300E as an example of how a stack 310 of the semiconductor material 304 and the sacrificial material 306 may be provided in the process 202, which various portions of the semiconductor material 304, in various layers, may be doped to convert the semiconductor material 304 into the doped semiconductor material 312. Although FIG. 3E and some of the subsequent drawings illustrate the same semiconductor material 304 and the same doped semiconductor material 312 in various layers of the stack 310, in general, material compositions of the semiconductor material 304 provided in different layers of the stack 310 may be different. For example, the semiconductor material 304 of one layer of the stack 310 may be silicon while the semiconductor material 304 of another layer of the stack 310 may be a III-N semiconductor material such as GaN. Similarly, the doped semiconductor materials 312 in different portions of different layers of the semiconductor materials 304 may be different in one or more of the types of dopants included (e.g., some portions of the doped semiconductor material 312 may include N-type dopants while other portions of the doped semiconductor material 312 may include P-type dopants), the combination of dopants included (e.g., in some portions the doped semiconductor material 312 may include phosphorus as dopants, while in the other portions the doped semiconductor material 312 may include arsenic as dopants, or a combination of phosphorous and arsenic), and the dopant concentrations (e.g., in some portions the doped semiconductor material 312 may include dopant concentrations that are different from the dopant concentrations in the other portions the doped semiconductor material 312). In general, these differences may be present not only when comparing one layer of the semiconductor material 304 to another layer, but also within a single layer of the semiconductor material 304. In other words, any given layer of the semiconductor material 304 may be doped in the process 202 such that different portions of that layer may include the doped semiconductor materials 312 that differ from one another in one or more of the types of dopants included, the combination of dopants included, and the dopant concentrations.

In some embodiments, portions of the semiconductor material 304 that are not doped in the process 202 may include the lowest dopant concentrations of dopants in the stack 310. For example, such portions may have dopant concentrations lower than about $10^{16}$ cm$^{-3}$, e.g., lower than about $5\times10^{15}$ cm$^{-3}$ or lower than about $10^{13}$-$10^{14}$ cm$^{-3}$. In some embodiments, the semiconductor material 304 may be a low-doped or a substantially intrinsic semiconductor material. On the other hand, portions of the semiconductor material 304 that were doped in the process 202 to provide the doped semiconductor material 312 instead of the semiconductor material 304 may include higher dopant concentrations of dopants, although typically not as high as those that may be included in the S/D regions of transistors. For example, the doped semiconductor material 312 in any of the portions of the stack 310 may have dopant concentrations at least 2 times, but typically at least 10 times (e.g., at least 50 times, or at least 100 times) greater the dopant concentrations of the semiconductor material 304. For example, in some embodiments, the doped semiconductor material 312 in any of the portions of the stack 310 may have dopant concentrations greater than about $10^{17}$ cm$^{-3}$, e.g., greater than about $10^{18}$ cm$^{-3}$, or greater than about $5\times10^{18}$ cm$^{-3}$.

In some embodiments, dopants may be provided in the process 202 by performing ion implantations on the desired portions of the semiconductor material 304, as is schematically illustrated in FIGS. 3B, 3C, and 3D by showing large arrows pointing to the doped semiconductor material 312 that is created from the semiconductor material 304 as a result. Although the large arrows represent in these drawings that ion implantation may be performed from the top side of the IC device, e.g., substantially perpendicular to the support structure 202, in other embodiments, ion implantation in the process 202, for any of the portions, may be performed at an angle that is not substantially perpendicular to the support structure 202. In various embodiments, dopants provided within any of the portions of the semiconductor material 304 in the process 202 may have uneven dopant concentrations throughout the portion (e.g., larger dopant concentrations at the surface and lower dopant concentrations further away from the surface). In this context, dopant concentrations described herein may be seen as average dopant concentrations. In other embodiments, dopants may be provided in the process 202 using an etching/deposition process, e.g., as described above with reference to the S/D regions 114.

Although not specifically illustrated in FIGS. 3A-3E, in some embodiments, the process 202 may include implementing another level of threshold voltage tuning. In particular, although the individual layers of the semiconductor material 304 are shown in these drawings to be spaced by about the same distance, in other embodiments, distance between different adjacent layers of the semiconductor material 304 may be varied. In the final IC devices, that would result in different distances between nearest nanoribbons within a given stack, which differences could be mirrored in the neighboring stacks as long as those different nanoribbon stacks are formed from the same stack 310 that was formed in the process 202. An example of such an IC device is shown in FIG. 4D, described below.

Once the stack 310 has been formed, with dopant concentration tuning in various portions and/or various nanoribbons as described above, the method 200 may proceed with any suitable further processes for forming nanoribbon-based transistors as known in the art. One example of such processes is shown with processes 204, 206, and 206 of the method 200, but all other embodiments of fabricating nanoribbon transistors based on a stack (e.g., the stack 310) of a semiconductor material and a sacrificial material as described herein are within the scope of the present disclosure.

Figure 3F:
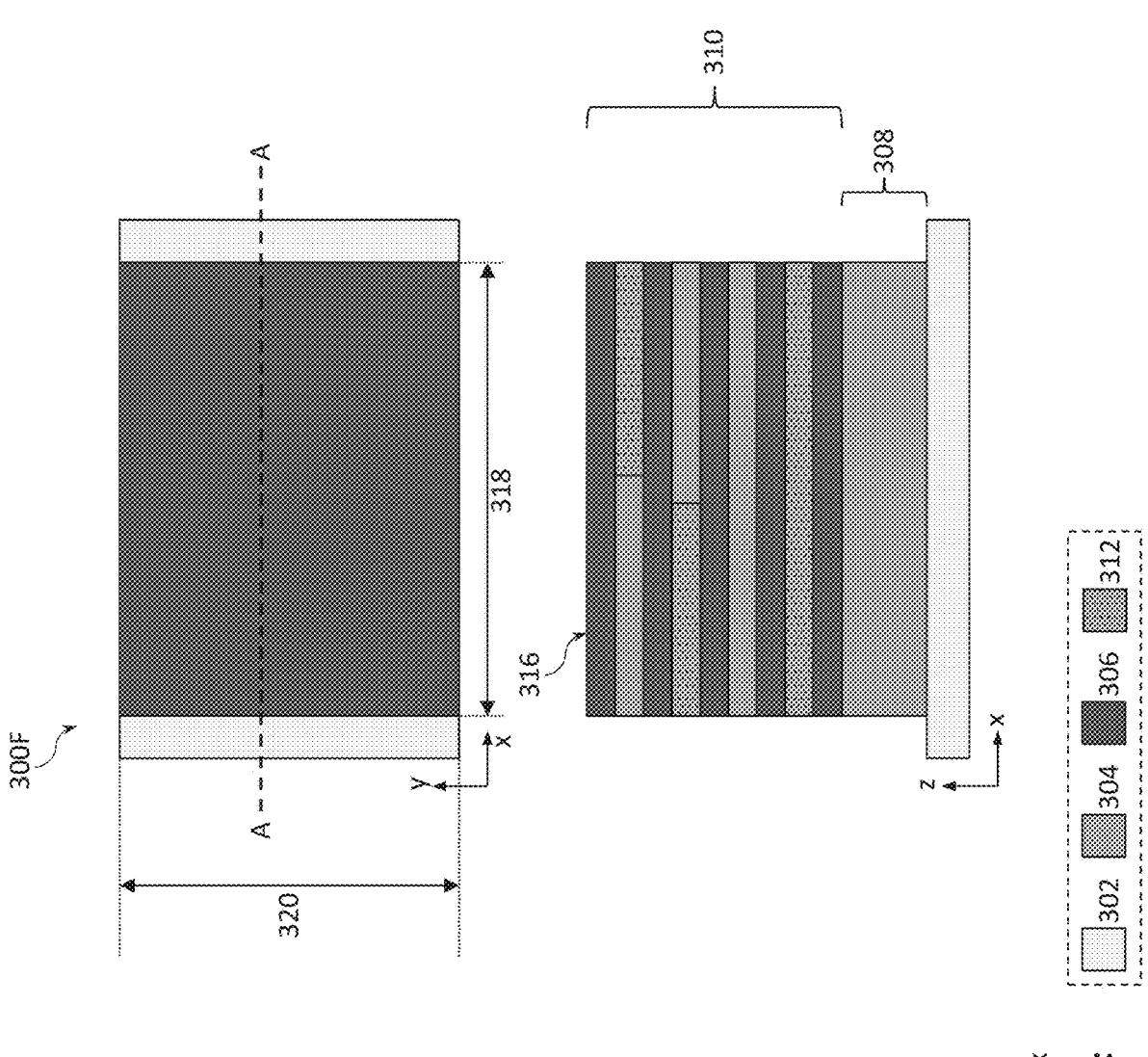

As shown in FIG. 2, a process 204 of the method 200 may include patterning the stack formed in the process 202 to form a fin from which the nanoribbons for the nanoribbon-based transistors may later be formed. An IC device 300F, shown in FIG. 3F illustrates an example result of performing the process 204 on the IC device that was formed in the process 202, e.g., on the IC device 300E. The IC device 304 illustrates that the stack 310 has been shaped to form a fin 316. The fin 316 may be shaped as a structure that extends away from the support structure 302, and having a width 318

(i.e., a dimension measured along the x-axis of the example coordinate system shown) that is suitable to account for two times the width of the future nanoribbons (e.g., as described above with reference to the width of the nanoribbon 104) and the width of the trench opening between the nanoribbon stacks. The fin 316 may further have a length 320 (i.e., a dimension measured along the y-axis of the example coordinate system shown) suitable to account for the length of the future nanoribbons (e.g., as described above with reference to the length of the nanoribbon 104). In various embodiments, any suitable patterning techniques may be used in the process 204 to form the fin 316, such as, but not limited to, photolithographic or electron-beam (e-beam) patterning, possibly in conjunction with a suitable etching technique, e.g., a dry etch, such as e.g., radio frequency (RF) reactive ion etch (RIE) or inductively coupled plasma (ICP) RIE. In some embodiments, the etch performed in the process 204 may include an anisotropic etch, using etchants in a form of e.g., chemically active ionized gas (i.e., plasma) using e.g., bromine (Br) and chloride (CI) based chemistries. In some embodiments, during the etch of the process 204, the IC device may be heated to elevated temperatures, e.g., to temperatures between about room temperature and 200 degrees Celsius, including all values and ranges therein, to promote that byproducts of the etch are made sufficiently volatile to be removed from the surface.

Figure 3G:
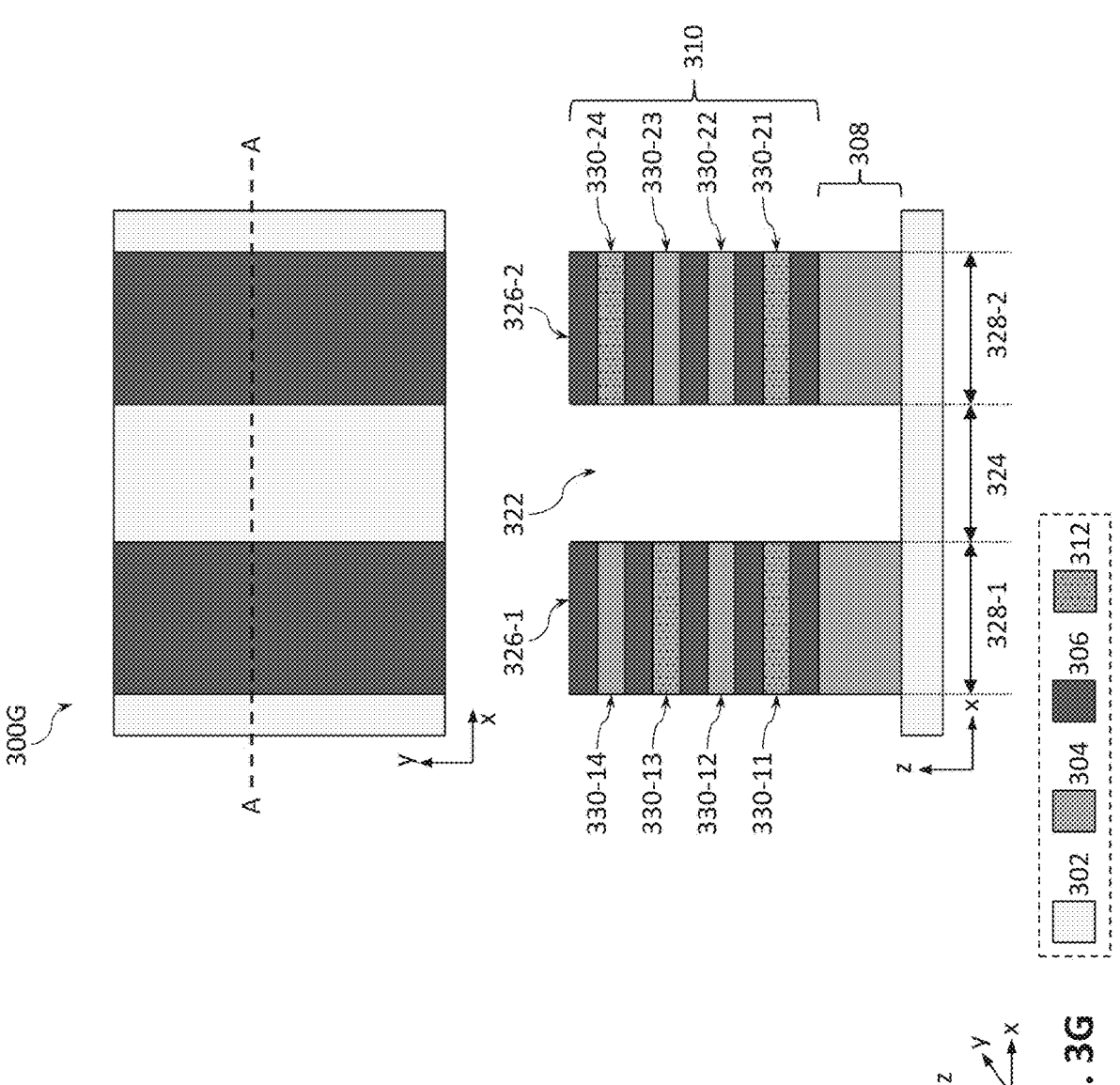

Optionally, the method 200 may also include a process 206, in which nanoribbons may be formed from the fin formed in the process 204, e.g., by forming a trench opening extending along the length of the fin formed in the process 204. An IC device 300G, shown in FIG. 3G, illustrates an example result of performing the process 206 on the IC device resulting from the process 204, e.g., on the IC device 300F. The IC device 300G illustrates that a trench opening 322 may be formed substantially in the center of the fin 316, the trench opening 322 extending along the length of the fin 316. In other embodiments, the trench opening 322 may be placed off-center with respect to the fin 316, e.g., if it is desired to create nanoribbon stacks of different widths, as described below with reference to FIG. 4C. In various embodiments, any suitable patterning techniques may be used in the process 206 to form the trench opening 322, e.g., any of those described above with reference to forming the fin 316. The trench opening 322 may have a width 324 and may divide the fin 316 into a first stack 326-1 having a width 328-1 and a second stack 326-2 having a width 328-2. In some embodiments, the width 324 may be between about 10 and 25 nanometers, including all values and ranges therein. In some embodiments, the trench opening 322 may extend all the way to the support structure 302, as is shown in the IC device 300G. In other embodiments, the trench opening 322 may be such that it does not reach all the way down to the support structure 302. The portions of the semiconductor material 304, including portions of the doped semiconductor material 312, within a given stack 326 are thus shaped as nanoribbons 330. In this manner, two stacks of nanoribbons 330 may be provided—the first stack 326-1 and the second stack 326-2. The individual nanoribbons 330 are labeled in FIG. 3G with reference numerals 330-11, 330-12, 330-13, and 330-14 for the nanoribbons 330 of the first stack 326-1 and with reference numerals 330-21, 330-22, 330-23, and 330-24 for the nanoribbons 330 of the second stack 326-2, but in subsequent drawings only one of the nanoribbons is labeled with a reference numeral 330 in order to not clutter the drawings.

Although only one trench opening 322 is shown in FIG. 3G, in various embodiments, the process 206 may include forming K such trench openings, where K is any integer equal to or greater than 1, in order to form K+1 stacks of nanoribbons from the fin 316. If the process 206 is not included in the method 200, then the method 200 may proceed from the process 204 to the process 208, where a single stack of nanoribbons is fabricated.

Figure 3H:
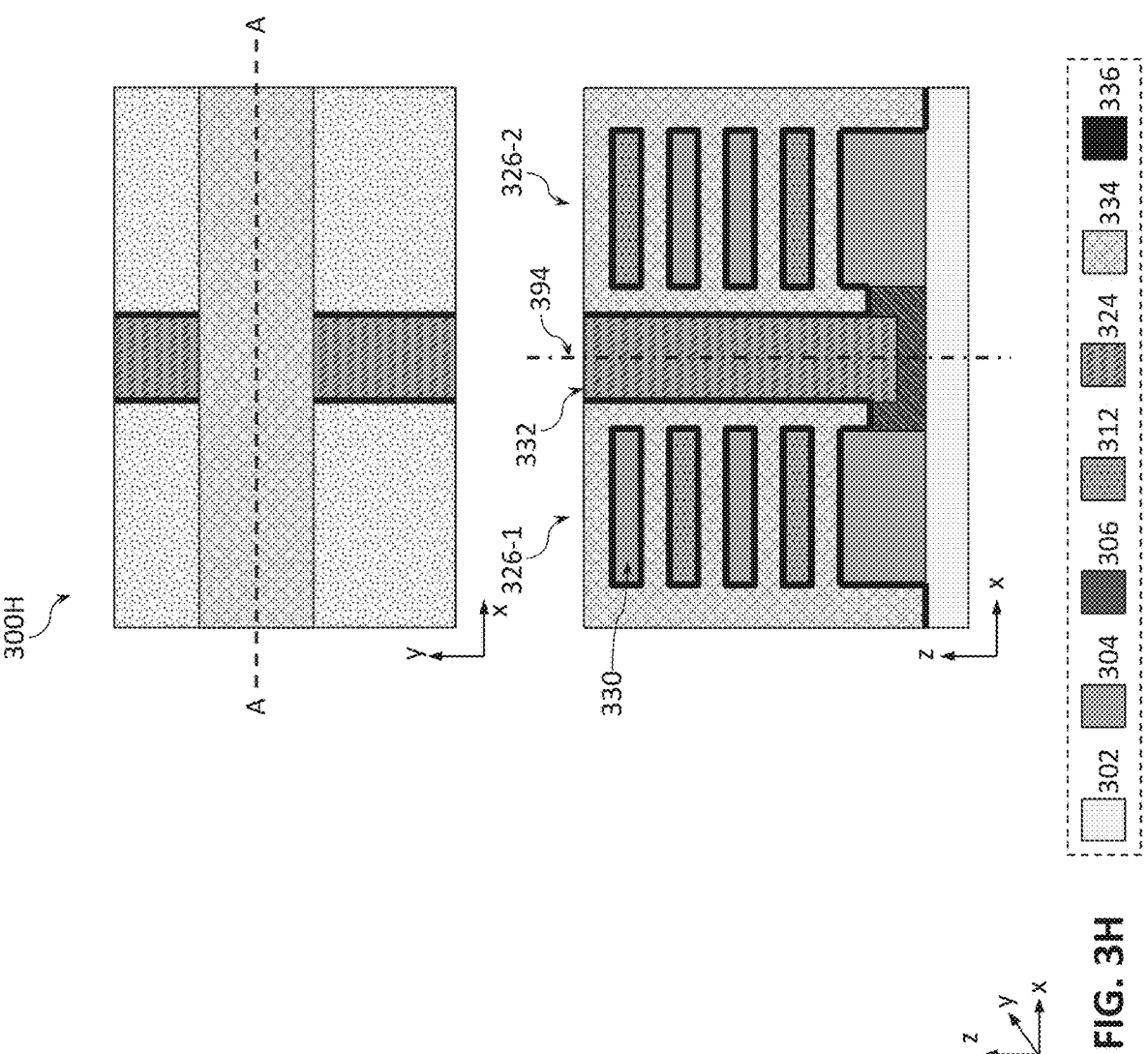

The process 208 of the method 200 may include performing the rest of nanoribbon-based transistor fabrication. For example, the process 208 may include removing the sacrificial material 306 to release the nanoribbons 330. Because the semiconductor material 304 and the sacrificial material 306 are etch-selective with respect to one another (and, consequently, the doped semiconductor material 312 and the sacrificial material 306 are etch-selective with respect to one another), removing the sacrificial material 306 (e.g., SiGe) of the stack(s) 326 in the process 208 may include etching the sacrificial material 306, e.g., using anisotropic etching, without substantially etching the semiconductor material 304 (e.g., Si) or the doped semiconductor material 312 (e.g., N-doped Si). The process 208 may also include, optionally, providing a wall 332 of a dielectric material 324 between the adjacent stacks 326 of nanoribbons 330. The process 208 may further include providing a gate stack of a gate electrode material 334 and, optionally, a gate dielectric material 336, e.g., using a replacement gate process as known in the art. The gate electrode material 334 may be the gate electrode material 108, described above, and the gate dielectric material 336 may be the gate dielectric material 112, described above. In some embodiments, the gate dielectric material 336 may be deposited using a conformal deposition technique once the nanoribbons 330 have been released, thus forming an opening around the nanoribbons 330, and once the wall 332 have been provided. In such embodiments, the gate dielectric material 336 may be deposited on all exposed surfaces within the opening (e.g., around the nanoribbons 330 and on the side walls of the wall 332, as shown in FIG. 3H) using any suitable techniques for conformally depositing dielectric materials onto selected surfaces, such as atomic layer deposition (ALD), chemical vapor deposition (CVD), plasma enhanced CVD (PECVD), or/and physical vapor deposition (PVD) processes such as sputter. The dielectric material 334 of the wall 332 may include any suitable dielectric materials, e.g., any of the materials described above with references to low-k or high-k dielectric materials. Although not specifically shown in FIG. 3H, S/D regions similar to the S/D regions 114, described above, may be provided within the nanoribbons 330, on either side of the gate stack formed by the gate electrode material 334 and the gate dielectric material 336.

FIGS. 4A-4D provide different further examples of example IC devices 400 implementing threshold voltage tuning for nanoribbon-based transistors, in accordance with some embodiments. Each of the IC devices 400 may be similar to the IC device 300H, shown in FIG. 3H, except for the differences described below.

Figures 4A, 4B:
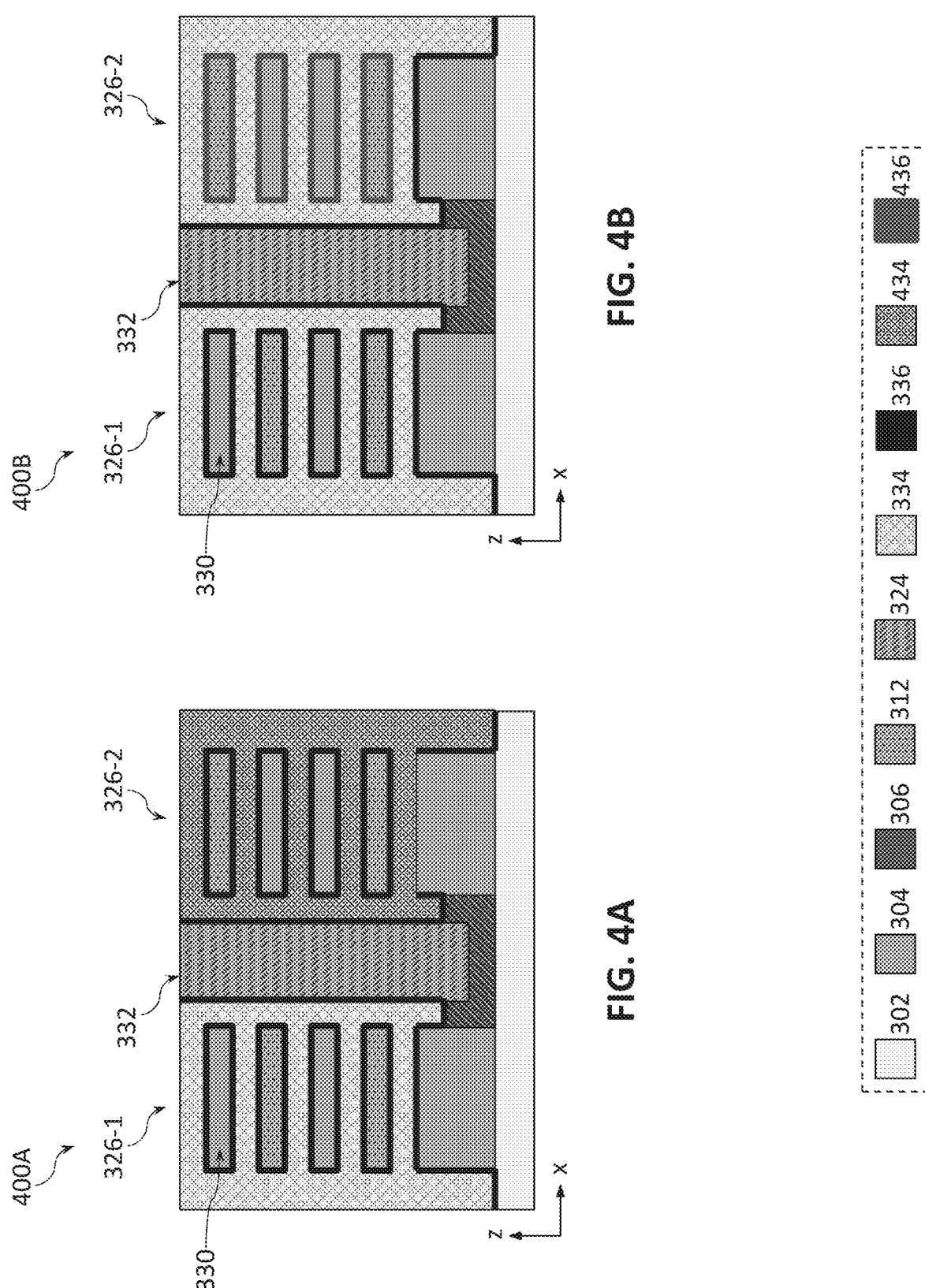
FIGS. 4A-4D provide different further examples of example IC devices implementing threshold voltage tuning for nanoribbon-based transistors, in accordance with some embodiments.
Figures 4C, 4D:
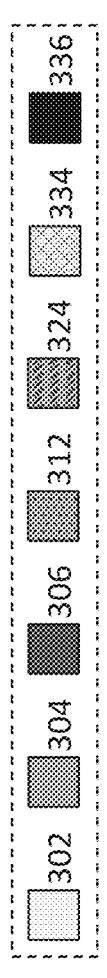

The IC device 400A, shown in FIG. 4A, illustrates an embodiment where different stacks 326 of the nanoribbons 330 may include different gate electrode materials. For example, the nanoribbon stack 326-1 may include the gate electrode material 334 for the transistors formed based on the nanoribbons 330 of that stack, while the nanoribbon stack 326-2 may include a gate electrode material 434 for the transistors formed based on the nanoribbons 330 of that stack. Similar to the gate electrode material 334, the gate electrode material 434 may also be the gate electrode material 108 as described above, but the material compositions of the gate electrode material 334 and the gate electrode material 434 may be different, thus changing the threshold voltage of the nanoribbon-based transistors formed in the nanoribbon stack 326-1 and the nanoribbon stack 326-2.

The IC device 400B, shown in FIG. 4B, illustrates an embodiment where different stacks 326 of the nanoribbons 330 may include different gate dielectric materials. For example, the nanoribbon stack 326-1 may include the gate dielectric material 336 for the transistors formed based on the nanoribbons 330 of that stack, while the nanoribbon stack 326-2 may include a gate dielectric material 436 for the transistors formed based on the nanoribbons 330 of that stack. Similar to the gate dielectric material 336, the gate dielectric material 436 may also be the gate dielectric material 112 as described above, but the material composi- tions of the gate dielectric material 336 and the gate dielec- tric material 436 may be different, thus changing the thresh- old voltage of the nanoribbon-based transistors formed in the nanoribbon stack 326-1 and the nanoribbon stack 326-2. Although not specifically shown in the present drawings, in some embodiments, thickness of the gate dielectric material used in one of the nanoribbon stacks 326 may be different from the thickness of the gate dielectric material used in another one of the nanoribbon stacks 326. Even when the material compositions of such gate dielectric materials may be the same, differences in thicknesses may ensure differ- ences in the threshold voltage of the nanoribbon-based transistors formed in these nanoribbon stacks.

The IC device 400C, shown in FIG. 4C, illustrates an embodiment where the nanoribbons 330 within different stacks 326 may have different widths. For example, the nanoribbons 330 of the nanoribbon stack 326-1 may have the width 328-1 that is smaller than the width 328-2 of the nanoribbons 330 of the nanoribbon stack 326-2, as shown in FIG. 4C, thus changing the threshold voltage of the nan- oribbon-based transistors formed in the nanoribbon stack 326-1 and the nanoribbon stack 326-2.

The IC device 400D, shown in FIG. 4D, illustrates an embodiment where, for a given nanoribbon stack 326, the distances between nearest nanoribbons 330 may be different. This may change the threshold voltage of the nanoribbon- based transistors formed in different nanoribbons 330 of a given nanoribbon stack 326.

The IC devices 100, 300, and 400, illustrated in the present drawings, do not represent an exhaustive set of IC devices in which threshold voltage tuning for nanoribbon- based transistors as described herein may be implemented, but merely provide examples of such devices. In various embodiments, any of the features described with reference to one of the IC devices 100, 300, and 400 may be combined with any of the features described with reference to another one of the IC devices 100, 300, and 400. For example, in some embodiments, both the gate electrode material and the gate dielectric material used in one of the nanoribbon stack 326 may be different from, respectively, the gate electrode material and the gate dielectric material used in another one of the nanoribbon stacks 326 (i.e., a combination of the features described with reference to the IC devices 400A and 400B). In another example, one or both of the gate electrode material and the gate dielectric material used in one of the nanoribbon stack 326 may be different from, respectively, the gate electrode material and the gate dielectric material used in another one of the nanoribbon stacks 326 where the nanoribbons 330 of different nanoribbon stacks 326 have different widths (i.e., a combination of the features described with reference to the IC devices 400A and 400C, a combi- nation of the features described with reference to the IC devices 400B and 400C, or combination of the features described with reference to the IC devices 400A, 400B, and 400C).

Although particular arrangements of materials are dis- cussed with reference to FIGS. 1, 3, and 4, intermediate materials may be included in various portions of these figures. Note that FIGS. 1, 3, and 4 are intended to show relative arrangements of some of the components therein, and that various device components of these figures may include other components that are not specifically illus- trated, e.g., various interfacial layers or various additional components or layers. Additionally, although some elements of the IC devices are illustrated in FIGS. 1, 3, and 4 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semi- conductor device assemblies. Therefore, descriptions of various embodiments of IC devices implementing threshold voltage tuning for nanoribbon-based transistors, provided herein, are equally applicable to embodiments where various elements of the resulting IC devices look different from those shown in the figures due to manufacturing processes used to form them.

IC devices implementing threshold voltage tuning for nanoribbon-based transistors, as disclosed herein may be included in any suitable electronic device or component. FIGS. 5-8 illustrate various examples of devices and com- ponents that may include one or more IC devices imple- menting threshold voltage tuning for nanoribbon-based tran- sistors as disclosed herein.

Figure 5:
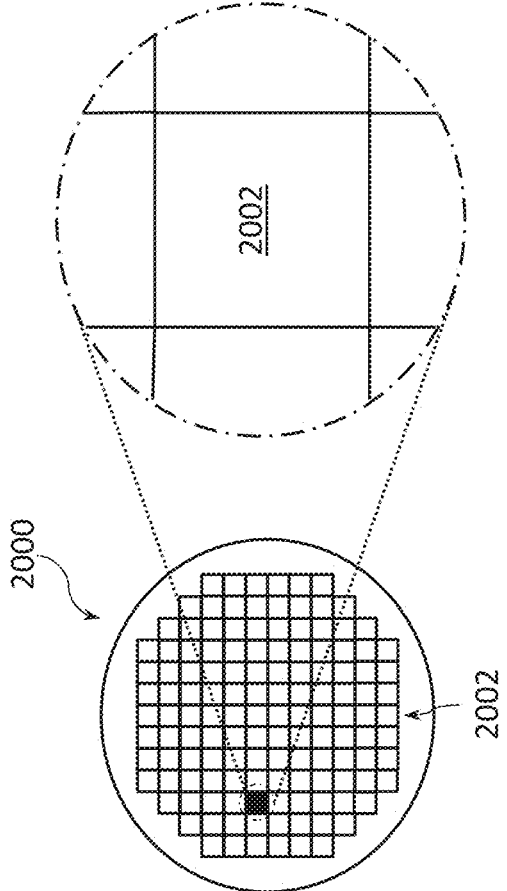
FIG. 5 provides top views of a wafer and dies that may include one or more IC devices implementing threshold voltage tuning for nanoribbon-based transistors, in accordance with various embodiments.

FIG. 5 are top views of a wafer 2000 and dies 2002 that may include one or more IC devices implementing threshold voltage tuning for nanoribbon-based transistors in accor- dance with any of the embodiments disclosed herein. In some embodiments, the dies 2002 may be included in an IC package, in accordance with any of the embodiments dis- closed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices implementing threshold voltage tuning for nanoribbon-based transistors as described herein). After the fabrication of the semiconductor product is complete (e.g., after manufacture of one or more IC devices imple- menting threshold voltage tuning for nanoribbon-based tran- sistors as described herein, e.g., after manufacture of any embodiments of the IC devices as described with reference to FIGS. 1, 3, and 4), the wafer 2000 may undergo a singulation process in which each of the dies 2002 is separated from one another to provide discrete "chips" of the semiconductor product. In particular, devices that include one or more IC devices implementing threshold voltage tuning for nanoribbon-based transistors as disclosed herein may take the form of the wafer 2000 (e.g., not singulated) or the form of the die 2002 (e.g., singulated). The die 2002 may include one or more transistors (e.g., nanoribbon-based transistors as described herein), diodes resistors, capacitors, and other IC components as well as, optionally, supporting circuitry to route electrical signals to the IC devices imple- menting threshold voltage tuning for nanoribbon-based tran- sistors and various other IC components. In some embodi- ments, the wafer 2000 or the die 2002 may implement an electrostatic discharge (ESD) protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
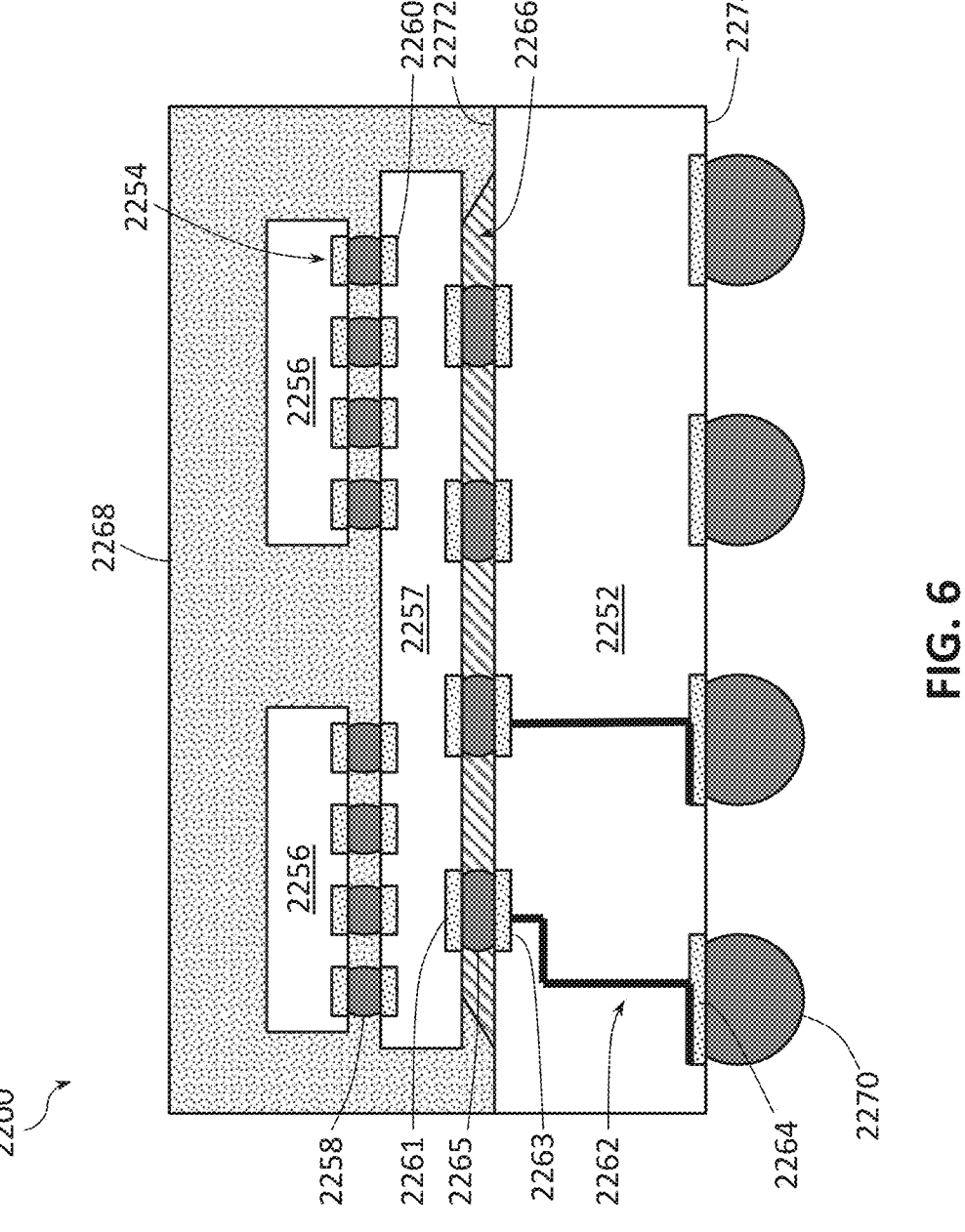
FIG. 6 is a cross-sectional side view of an IC package that may include one or more IC devices implementing threshold voltage tuning for nanoribbon-based transistors, in accordance with various embodiments.

FIG. 6 is a side, cross-sectional view of an example IC package 2200 that may include one or more IC devices implementing threshold voltage tuning for nanoribbon-based transistors in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC device implementing threshold voltage tuning for nanoribbon-based transistors, e.g., any embodiments of the IC devices as described with reference to FIGS. 1, 3, and 4. In embodiments in which the IC package 2200 includes multiple dies 2256, the IC package 2200 may be referred to as a multi-chip package. Importantly, even in such embodiments of an MCP implementation of the IC package 2200, one or more IC devices implementing threshold voltage tuning for nanoribbon-based transistors may be provided in a single chip, in accordance with any of the embodiments described herein. The dies 2256 may include circuitry to perform any desired functionality. For example, one or more of the dies 2256 may be logic dies, including one or more IC devices implementing threshold voltage tuning for nanoribbon-based transistors as described herein, one or more of the dies 2256 may be memory dies (e.g., high bandwidth memory) with one or more IC devices implementing threshold voltage tuning for nanoribbon-based transistors, etc. In some embodiments, any of the dies 2256 may include one or more IC devices implementing threshold voltage tuning for nanoribbon-based transistors, e.g., as discussed above; in some embodiments, at least some of the dies 2256 may not include any IC devices implementing threshold voltage tuning for nanoribbon-based transistors.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
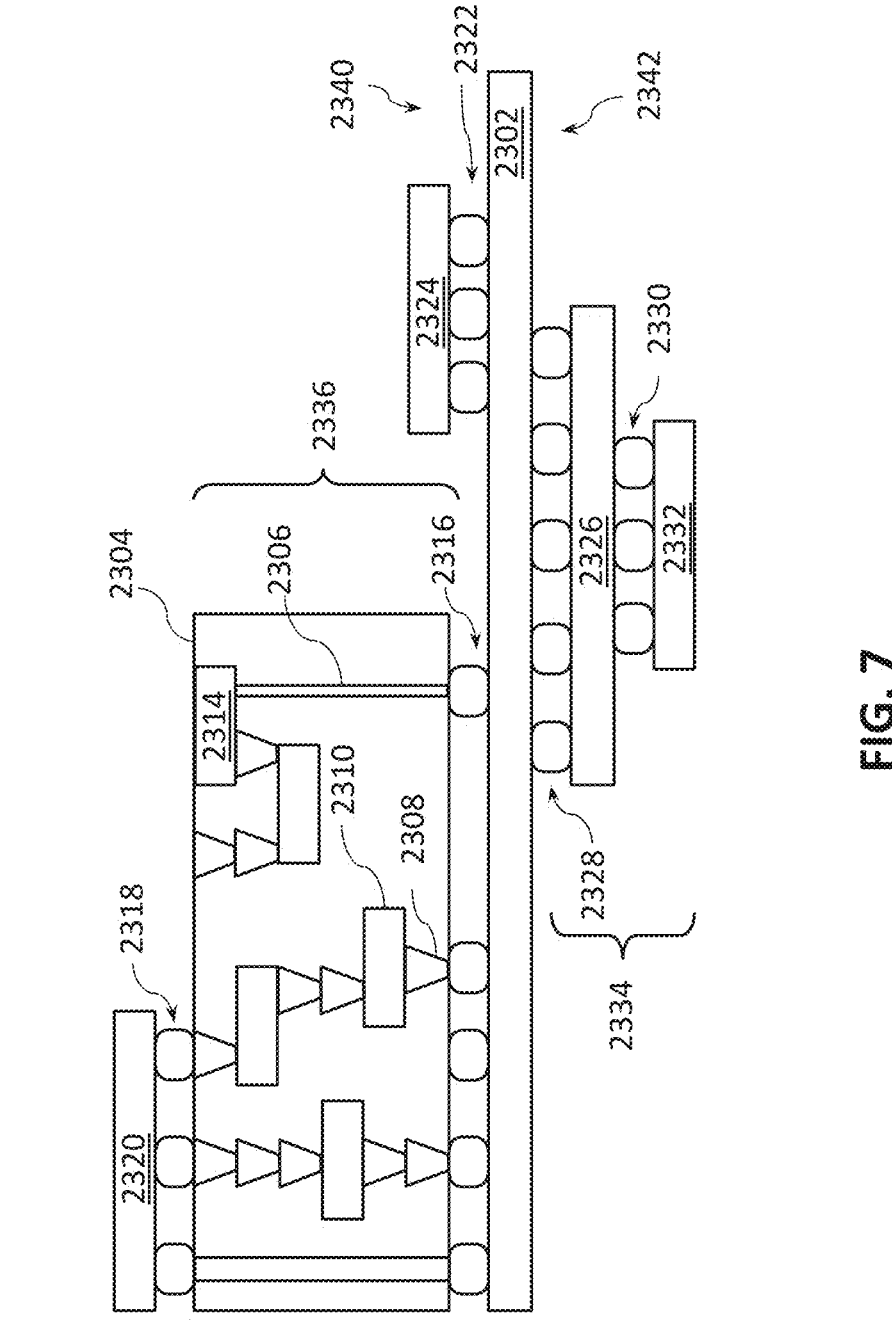
FIG. 7 is a cross-sectional side view of an IC device assembly that may include one or more IC devices implementing threshold voltage tuning for nanoribbon-based transistors, in accordance with various embodiments.

FIG. 7 is a cross-sectional side view of an IC device assembly 2300 that may include components having one or more IC devices implementing threshold voltage tuning for nanoribbon-based transistors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing threshold voltage tuning for nanoribbon-based transistors in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more IC devices implementing threshold voltage tuning for nanoribbon-based transistors in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5), an IC device (e.g., any embodiments of the IC devices as described with reference to FIGS. 1, 3, and 4), or any other suitable component. In particular, the IC package 2320 may include one or more IC devices implementing threshold voltage tuning for nanoribbon-based transistors as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing threshold voltage tuning for nanoribbon-based transistors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
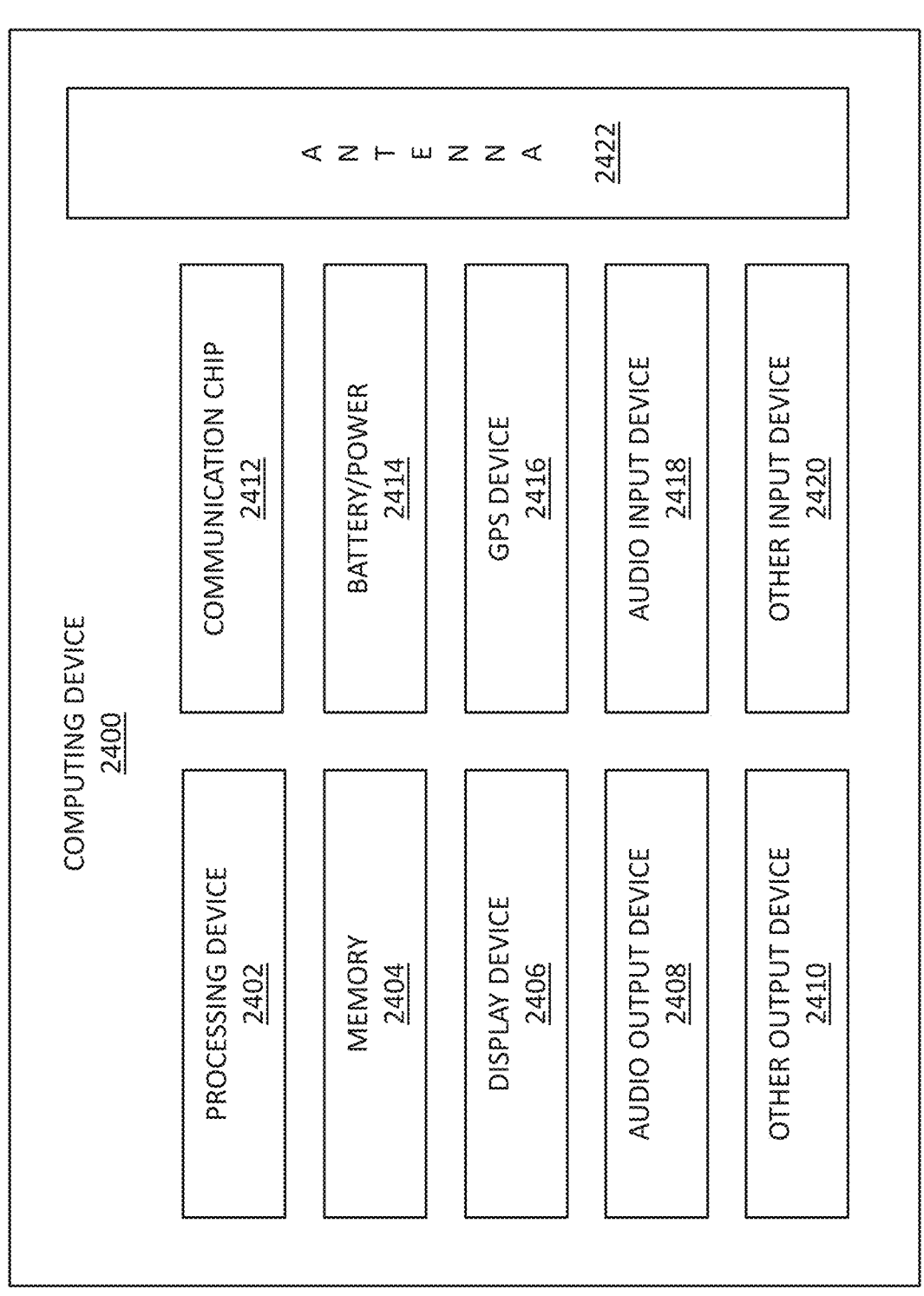
FIG. 8 is a block diagram of an example computing device that may include one or more IC devices implementing threshold voltage tuning for nanoribbon-based transistors, in accordance with various embodiments.

FIG. 8 is a block diagram of an example computing device 2400 that may include one or more components with one or more IC devices implementing threshold voltage tuning for nanoribbon-based transistors in accordance with any of the embodiments disclosed herein. For example, any suitable ones of the components of the computing device 2400 may include a die (e.g., the die 2002 of FIG. 5) including one or more IC devices implementing threshold voltage tuning for nanoribbon-based transistors in accordance with any of the embodiments disclosed herein. Any of the components of the computing device 2400 may include an IC device (e.g., any embodiment of the IC devices of FIGS. 1, 3, and 4) and/or an IC package (e.g., the IC package 2200 of FIG. 6). Any of the components of the computing device 2400 may include an IC device assembly (e.g., the IC device assembly 2300 of FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-chip (SoC) die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices implementing threshold voltage tuning for nanoribbon-based transistors as described herein may be particularly advantageous for use as part of ESD circuits protecting power amplifiers, low-noise amplifiers, filters (including arrays of filters and filter banks), switches, or other active components. In some embodiments, IC devices implementing threshold voltage tuning for nanoribbon-based transistors as described herein may be used in PMICs, e.g., as a rectifying diode for large currents. In some embodiments, IC devices implementing threshold voltage tuning for nanoribbon-based transistors as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure (e.g., a substrate, a wafer, a die, or a chip); and a nanoribbon stack that includes a plurality of nanoribbons stacked above one another over the support structure, the plurality of nanoribbons including at least a first nanoribbon and a second nanoribbon, where the first nanoribbon includes a first semiconductor material with dopants at a first dopant concentration, the second nanoribbon includes a second semiconductor material with dopants at a second dopant concentration, and the first dopant concentration is at least 2-10 times different (e.g., at least 50 times different or at least 100 times different) from the second dopant concentration. In various embodiments, the first and second semiconductor materials may be the same or different semiconductor materials.

Example 2 provides the IC device according to example 1, where the second dopant concentration is lower than about $10^{16}$ cm$^{-3}$, e.g., lower than about $5\times10^{15}$ cm$^{-3}$ (i.e., the semiconductor material of the second nanoribbon may be a low-doped or a substantially intrinsic semiconductor material), the first dopant concentration is greater than about $10^{17}$ cm$^{-3}$, e.g., greater than about $10^{18}$ cm$^{-3}$, or greater than about $5\times10^{18}$ cm$^{-3}$ (i.e., the semiconductor material of the first nanoribbon may be an extrinsic semiconductor material).

Example 3 provides the IC device according to example 2, where the first nanoribbon is between the support structure and the second nanoribbon.

Example 4 provides the IC device according to example 2, where the second nanoribbon is between the support structure and the first nanoribbon.

Example 5 provides the IC device according to any one of the preceding examples, where the second semiconductor material is different from the first semiconductor material.

Example 6 provides the IC device according to any one of the preceding examples, where the nanoribbon stack is a first nanoribbon stack and the plurality of nanoribbons is a first plurality of nanoribbons, the IC device further includes a second nanoribbon stack, proximate the first nanoribbon stack and including a second plurality of nanoribbons stacked above one another over the support structure, the second plurality of nanoribbons including at least a third nanoribbon and a fourth nanoribbon, a projection of the second plurality of nanoribbons onto a plane of the support structure is substantially parallel to a projection of the first plurality of nanoribbons onto the plane of the support structure, a distance between the third nanoribbon and the support structure is substantially equal to a distance between the first nanoribbon and the support structure, and a distance between the fourth nanoribbon and the support structure is substantially equal to a distance between the second nanoribbon and the support structure.

Example 7 provides the IC device according to example 6, where a distance between the first nanoribbon stack and the second nanoribbon stack is less than about 100 nanometers, including all values and ranges therein, e.g., less than about 50 nanometers, or less than about 30 nanometers. More generally, the distance between the first nanoribbon stack and the second nanoribbon stack may be less than about 100% than a width of the first nanoribbon stack or a width of the second nanoribbon stack, including all values and ranges therein, e.g., less than about 80%, or less than about 50%.

Example 8 provides the IC device according to examples 6 or 7, where the third nanoribbon includes the first semiconductor material (i.e., the first and third nanoribbons may be formed from a single layer of a semiconductor material, before the single layer is patterned into fin-like structures) with dopants at a third dopant concentration, and the third dopant concentration is different (e.g., at least 10 times different, at least 50 times different or at least 100 times different) from the first dopant concentration. Thus, even though the first and third nanoribbons may be formed from a single layer of a semiconductor material, that layer may be selectively doped in some regions but not the others, resulting in nanoribbons of a given layer above the support structure but provided in adjacent stacks having different dopant concentrations. In this manner, threshold voltage of transistors built based on different nanoribbons may, advantageously, be tuned for individual nanoribbon stacks.

In still further embodiments, a single layer of a semiconductor material may be selectively doped in different regions with different types of dopants. This may result in both the first nanoribbon and the third nanoribbon of any one of examples 6-8 including doped semiconductor materials, but with dopants of different types (e.g., the first nanoribbon may include a semiconductor material with dopants of a first type, and the third nanoribbon may include a semiconductor material with dopants of a second type, where one of the first and second types is an N-type and the other one is a P-type).

Example 9 provides the IC device according to example 8, where the third dopant concentration is substantially equal the second dopant concentration.

Example 10 provides the IC device according to any one of examples 6-9, where a width of the first nanoribbon stack is different from a width of the second nanoribbon stack. Thus, widths of nanoribbons may be individually tuned on a per-stack basis (i.e., nanoribbons of a given nanoribbon stack may all have substantially the same width, but a width of the nanoribbons of one stack may be different than a width of the nanoribbons of another stack).

Example 11 provides the IC device according to any one of the preceding examples, where a gate electrode material transistors of the first nanoribbon stack is different from a gate electrode material transistors of the second nanoribbon stack. Thus, gate electrode materials (workfunction materials) of nanoribbons may be individually tuned on a per-stack basis (i.e., nanoribbons of a given nanoribbon stack may all have substantially the same gate electrode material, but a gate electrode material of the nanoribbons of one stack may be different than a gate electrode material of the nanoribbons of another stack).

Example 12 provides the IC device according to any one of the preceding examples, where the plurality of nanoribbons of the nanoribbon stack further includes a third nanoribbon, the second nanoribbon is between the first nanoribbon and the third nanoribbon with no other nanoribbons in between, and a distance between the second nanoribbon and the first nanoribbon is different from a distance between the second nanoribbon and the third nanoribbon. Thus, the distance between adjacent nanoribbons within a single nanoribbon stack may be individually tuned.

Example 13 provides an IC package that includes an IC die, the IC die including an IC device according to any one of the preceding examples; and a further IC component, coupled to the IC die. For example, the IC device may include a nanoribbon stack of a plurality of nanoribbons stacked above one another, a first transistor having a channel portion that is a part of a first nanoribbon of the nanoribbon stack, and a second transistor having a channel portion that is a part of a second nanoribbon of the nanoribbon stack, where a dopant concentration of the channel portion of the first transistor is at least 2 times, or at least 10 times different from a dopant concentration of the channel portion of the second transistor.

Example 14 provides the IC package according to example 13, where the further IC component includes one of a package substrate, an interposer, or a further IC die.

Example 15 provides an electronic device (e.g., a computing device) that includes a carrier substrate; and an IC die coupled to the carrier substrate, where the IC die includes the IC device according to any one of examples 1-12, and/or is included in the IC package according to any one of examples 13-14.

Example 16 provides the electronic device according to example 15, where the electronic device is a wearable or handheld electronic device.

Example 17 provides the electronic device according to examples 15 or 16, where the electronic device further includes one or more communication chips and an antenna.

Example 18 provides the electronic device according to any one of examples 15-17, where the carrier substrate is a motherboard.

Example 19 provides a method of fabricating an IC device, the method including providing a stack of first and second semiconductor materials over a support structure (e.g., a substrate, a chip, or a wafer); patterning the stack to form a fin having a width and a length suitable for nanoribbons; processing the fin to form a nanoribbon stack that includes a plurality of nanoribbons stacked above one another, the plurality of nanoribbons including at least a first nanoribbon and a second nanoribbon; and forming transistors based on the nanoribbons, where providing the stack of first and second semiconductor materials includes adding dopants to at least a portion of at least one of the first and second semiconductor materials, and where said portion is part of at least one of the transistors.

Example 20 provides the method according to example 19, where providing the stack of first and second semiconductor materials includes providing a first layer of a sacrificial material (e.g., SiGe) over the support structure; providing a layer of the first semiconductor material (e.g., Si)

over the first layer (e.g., a layer of a semiconductor material suitable for forming a first nanoribbon of a stack of nanoribbons); providing a second layer of the sacrificial material (e.g., SiGe) over the layer of the first semiconductor material; and providing a layer of the second semiconductor material (e.g., Si) over the second layer (e.g., a layer of a semiconductor material suitable for forming a second nanoribbon of a stack of nanoribbons, which material may, but does not have to be, the same as the first semiconductor material), where at least one of providing the layer of the first semiconductor material includes adding the dopants to at least a portion of the layer of the first semiconductor material, and providing the layer of the second semiconductor material includes adding the dopants to at least a portion of the layer of the second semiconductor material.

Example 21 provides the method according to example 20, where processing the fin includes forming the first nanoribbon from the layer of the first semiconductor material and forming the second nanoribbon from the layer of the second semiconductor material.

Example 22 provides the method according to examples 20 or 21, where the sacrificial material is etch-selective with respect to the first semiconductor material and the second semiconductor material.

Example 23 provides the method according to any one of examples 19-22, where the first nanoribbon includes the first semiconductor material with dopants at a first dopant concentration, the second nanoribbon includes the second semiconductor material with dopants at a second dopant concentration, and the first dopant concentration is at least 2-10 times different (e.g., at least 50 times different or at least 100 times different) from the second dopant concentration.

Example 24 provides the method according to example 23, where the second dopant concentration is lower than about $10^{16}$ cm$^{-3}$, e.g., lower than about $5 \times 10^{15}$ cm$^{-3}$ (i.e., the semiconductor material of the second nanoribbon may be a low-doped or a substantially intrinsic semiconductor material), the first dopant concentration is greater than about $10^{17}$ cm$^{-3}$, e.g., greater than about $10^{18}$ cm$^{-3}$, or greater than about $5 \times 10^{18}$ cm$^{-3}$ (i.e., the semiconductor material of the first nanoribbon may be an extrinsic semiconductor material).

Example 25 provides the method according to any one of examples 19-24, further including processes for forming the IC device according to any one of the preceding examples.

Example 26 provides the method according to any one of examples 19-25, further including processes for forming the IC package according to any one of the preceding examples.

Example 27 provides the method according to any one of examples 19-26, further including processes for forming the electronic device according to any one of the preceding examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a support structure; and
   a nanoribbon stack, including a plurality of nanoribbons
      stacked above one another over the support structure, the plurality of nanoribbons including at least a first nanoribbon, a second nanoribbon, and a third nanoribbon, wherein:

the first nanoribbon includes a first semiconductor material with dopants at a first dopant concentration, the second nanoribbon includes a second semiconductor material with dopants at a second dopant concentration, the first dopant concentration is at least 2 times different from the second dopant concentration, the second nanoribbon is between the first nanoribbon and the third nanoribbon with no other nanoribbons in between, and a distance between the second nanoribbon and the first nanoribbon is different from a distance between the second nanoribbon and the third nanoribbon.

2. The IC device according to claim 1, wherein:

the second dopant concentration is lower than about $10^{16}$ dopants per cubic centimeter, and the first dopant concentration is greater than about $10^{17}$ dopants per cubic centimeter.

3. The IC device according to claim 2, wherein the first nanoribbon is between the support structure and the second nanoribbon.

4. The IC device according to claim 2, wherein the second nanoribbon is between the support structure and the first nanoribbon.

5. The IC device according to claim 1, wherein the second semiconductor material is different from the first semiconductor material.

6. The IC device according to claim 1, wherein:

the nanoribbon stack is a first nanoribbon stack, the plurality of nanoribbons is a first plurality of nanoribbons, the IC device further includes a second nanoribbon stack, proximate the first nanoribbon stack and including a second plurality of nanoribbons stacked above one another over the support structure, the second plurality of nanoribbons including at least a third nanoribbon and a fourth nanoribbon, a projection of the second plurality of nanoribbons onto a plane of the support structure is substantially parallel to a projection of the first plurality of nanoribbons onto the plane of the support structure, a distance between the third nanoribbon and the support structure is substantially equal to a distance between the first nanoribbon and the support structure, and a distance between the fourth nanoribbon and the support structure is substantially equal to a distance between the second nanoribbon and the support structure.

7. The IC device according to claim 6, wherein a distance between the first nanoribbon stack and the second nanoribbon stack is less than about 100 nanometers.

8. The IC device according to claim 6, wherein:

the third nanoribbon includes the first semiconductor material with dopants at a third dopant concentration, and the third dopant concentration is different from the first dopant concentration.

9. The IC device according to claim 8, wherein the third dopant concentration is substantially equal the second dopant concentration.

10. The IC device according to claim 6, wherein a width of the first nanoribbon stack is different from a width of the second nanoribbon stack.

11. The IC device according to claim 6, wherein a gate electrode material transistors of the first nanoribbon stack is different from a gate electrode material transistors of the second nanoribbon stack.

12. The IC device according to claim 1, further including:

a die; and a further component coupled to the die, wherein:

the further component includes one of another die, an interposer, a package substrate, or a circuit board, and the die includes the support structure and the nanoribbon stack.

13. An integrated circuit (IC) device, comprising:

a first nanoribbon stack comprising a first nanoribbon, a second nanoribbon stacked above the first nanoribbon, and a third nanoribbon stacked above the second nanoribbon; and a second nanoribbon stack proximate the first nanoribbon stack and comprising at least a fourth nanoribbon and a fifth nanoribbon stacked above the fourth nanoribbon, wherein:

the second nanoribbon is between the first nanoribbon and the third nanoribbon with no other nanoribbons in between, a distance between the second nanoribbon and the first nanoribbon is different from a distance between the second nanoribbon and the third nanoribbon, the fourth nanoribbon is substantially parallel to the first nanoribbon, the fourth nanoribbon is substantially coplanar with the first nanoribbon, the first nanoribbon and the second nanoribbon include a first semiconductor material, the second nanoribbon includes a second semiconductor material, a dopant concentration of dopants of the first nanoribbon is different from a dopant concentration of dopants of the fourth nanoribbon, and the dopant concentration of the dopants of the fourth nanoribbon is substantially equal a dopant concentration of dopants of the second nanoribbon.

14. The IC device according to claim 13, wherein:

the dopant concentration of the dopants of the first nanoribbon is at least 2 times different from the dopant concentration of the dopants of the second nanoribbon.

15. The IC device according to claim 13, further including:

a die; and a further component coupled to the die, wherein:

the further component includes one of another die, an interposer, a package substrate, or a circuit board, and the die includes the first nanoribbon stack and the second nanoribbon stack.

16. An integrated circuit (IC) device, comprising:

a first nanoribbon stack comprising at least a first nanoribbon; and a second nanoribbon stack comprising at least a second nanoribbon, wherein:

the second nanoribbon stack is substantially parallel to the first nanoribbon stack, the second nanoribbon is substantially coplanar with the first nanoribbon,

a dopant concentration of dopants of the first nanorib-
bon is different from a dopant concentration of
dopants of the second nanoribbon, the first nanoribbon stack further includes a third nan-
oribbon, either the third nanoribbon is stacked above the first
nanoribbon or the first nanoribbon is stacked above
the third nanoribbon, and the dopant concentration of the dopants of the second
nanoribbon is substantially equal to a dopant con-
centration of dopants of the third nanoribbon.

17. The IC device according to claim 16, wherein:

the dopant concentration of the dopants of the first nan-
oribbon is at least 2 times different from the dopant
concentration of the dopants of the third nanoribbon.

18. The IC device according to claim 16, wherein:

the third nanoribbon is stacked above the first nanoribbon, the first nanoribbon stack further includes a fourth nan-
oribbon stacked above the third nanoribbon, the third nanoribbon is between the first nanoribbon and
the fourth nanoribbon with no other nanoribbons in
between, and a distance between the third nanoribbon and the first
nanoribbon is different from a distance between the
third nanoribbon and the fourth nanoribbon.

19. The IC device according to claim 16, wherein:

the third nanoribbon is stacked above the first nanoribbon, the first nanoribbon stack further includes a fourth nan-
oribbon stacked above the third nanoribbon, and a distance between the third nanoribbon and the first
nanoribbon is different from a distance between the
third nanoribbon and the fourth nanoribbon.

20. The IC device according to claim 16, further includ-
ing:

a die; and a further component coupled to the die, wherein:

the further component includes one of another die, an
interposer, a package substrate, or a circuit board,
and the die includes the first nanoribbon stack and the
second nanoribbon stack.

\* \* \* \* \*